US012598852B2

(12) United States Patent 
Hwang et al.

(10) Patent No.: US 12,598,852 B2 
(45) Date of Patent: Apr. 7, 2026

(54) LIGHT-EMITTING ELEMENT AND DISPLAY DEVICE COMPRISING SAME

(71) Applicant: LG ELECTRONICS INC., Seoul (KR)

(72) Inventors: Sunghyun Hwang, Seoul (KR); Mihee Heo, Seoul (KR); Kiseong Jeon, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 363 days.

(21) Appl. No.: 18/037,657

(22) PCT Filed: Nov. 25, 2020

(86) PCT No.: PCT/KR2020/016821 
§ 371 (c)(1), 
(2) Date: May 18, 2023

(87) PCT Pub. No.: WO2022/114255 
PCT Pub. Date: Jun. 2, 2022

(65) Prior Publication Data 
US 2023/0402489 A1      Dec. 14, 2023

(51) Int. Cl. 
*H10H 29/10*          (2025.01) 
*H10H 20/01*          (2025.01) 
*H10H 20/83*          (2025.01)

(52) U.S. Cl. 
CPC .......... *H10H 29/10* (2025.01); *H10H 20/013* (2025.01); *H10H 20/83* (2025.01); *H10H 20/036* (2025.01)

(58) Field of Classification Search 
CPC ...... H10H 29/10; H10H 20/013; H10H 20/83; H10H 20/036; H10H 20/819; 
(Continued)

(56) References Cited

U.S. PATENT DOCUMENTS

| | | | |
|---|---|---|---|
| 2002/0121643 A1 | 9/2002 | Mizuno et al. | |
| 2006/0220031 A1* | 10/2006 | Krames ................ | H10H 20/824 |
| | | | 257/79 |

(Continued)

FOREIGN PATENT DOCUMENTS

| | | |
|---|---|---|
| CN | 103443942 A | 12/2013 |
| JP | 10-145003 A | 5/1998 |

(Continued)

OTHER PUBLICATIONS

International Search Report (PCT/ISA/210) issued in PCT/KR2020/016821, dated Aug. 19, 2021.

*Primary Examiner* — Sitaramarao S Yechuri 
(74) *Attorney, Agent, or Firm* — Birch, Stewart, Kolasch & Birch, LLP

(57)          ABSTRACT

The light emitting device includes an active layer, a plurality of first conductivity-type semiconductor layers under the active layer, and a plurality of second conductivity-type semiconductor layers on the active layer. The plurality of first conductivity-type semiconductor layers include an adsorption prevention layer spaced farthest from the active layer. 
The adsorption prevention layer can include $Al_{x1}Ga_{(1-x1)}InP$, x1 can be 0.6 or less, and the thickness of the adsorption prevention layer can be 2 μm or less.

20 Claims, 15 Drawing Sheets

150B

(58) Field of Classification Search
  CPC .... H10H 20/824; H10H 20/831; H10H 20/85;
         H10H 20/857; H01L 2224/95101; H01L
                                        25/0753
  See application file for complete search history.

(56) References Cited

U.S. PATENT DOCUMENTS

| | | | |
|---|---|---|---|
| 2010/0258826 A1* | 10/2010 | Takeuchi | H10H 20/831 |
| | | | 438/47 |
| 2011/0031528 A1 | 2/2011 | Nagatake et al. | |
| 2018/0190672 A1* | 7/2018 | Lee | H10D 86/60 |
| 2018/0219139 A1 | 8/2018 | Sasaki et al. | |
| 2022/0367774 A1 | 11/2022 | Kim et al. | |
| 2023/0081184 A1 | 3/2023 | Kang et al. | |
| 2023/0107331 A1 | 4/2023 | Heo et al. | |

FOREIGN PATENT DOCUMENTS

| | | | |
|---|---|---|---|
| JP | 2004-247654 A | 9/2004 |
| KR | 10-2019-0017691 A | 2/2019 |
| KR | 10-2019-0113695 A | 10/2019 |
| KR | 10-2020-0018521 A | 2/2020 |
| KR | 10-2020-0023328 A | 3/2020 |

* cited by examiner

[FIG. 1]
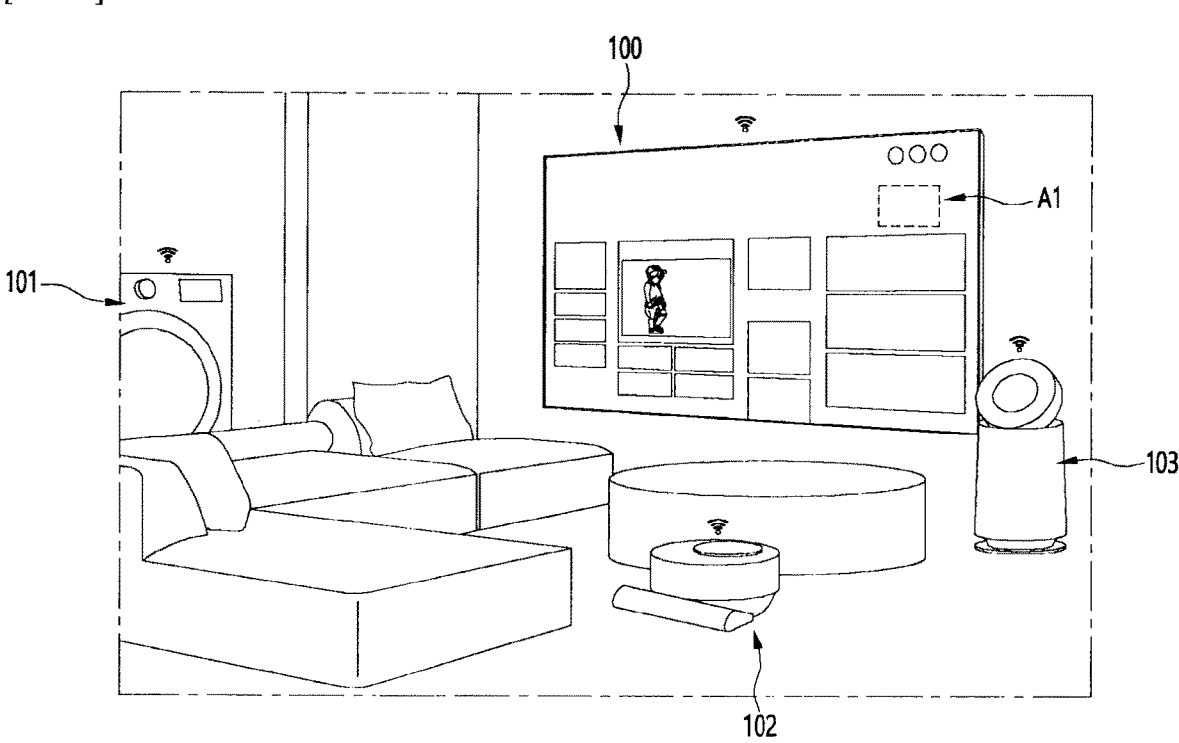

[FIG. 2]
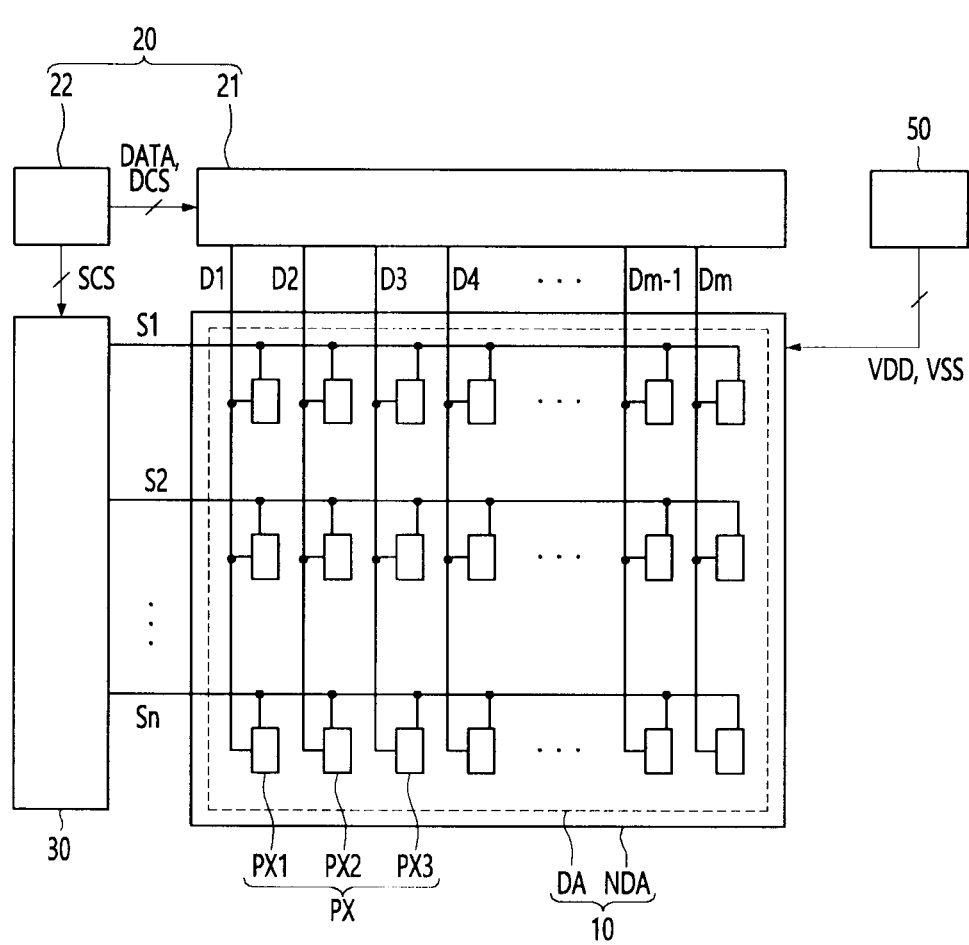

[FIG. 3]
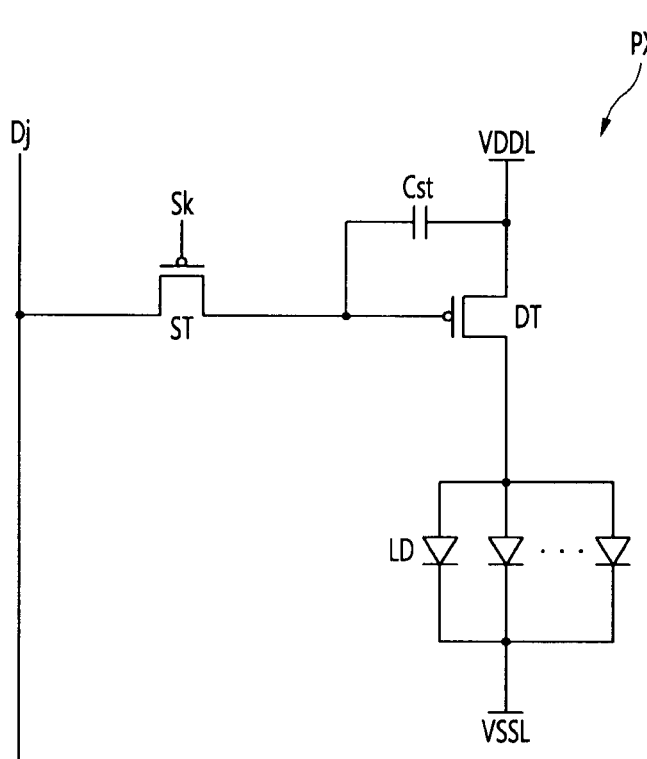

[FIG. 4]
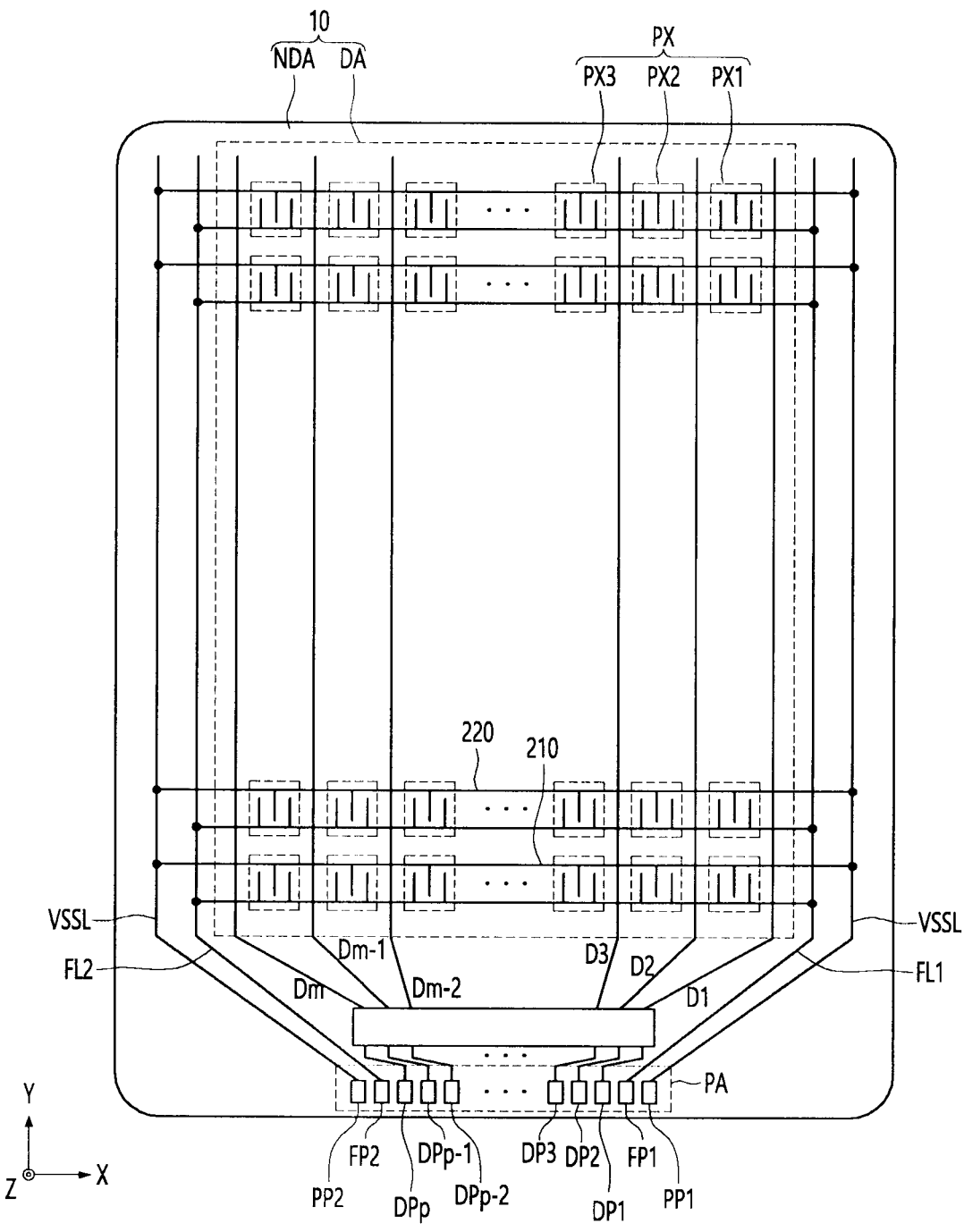

[FIG. 5]
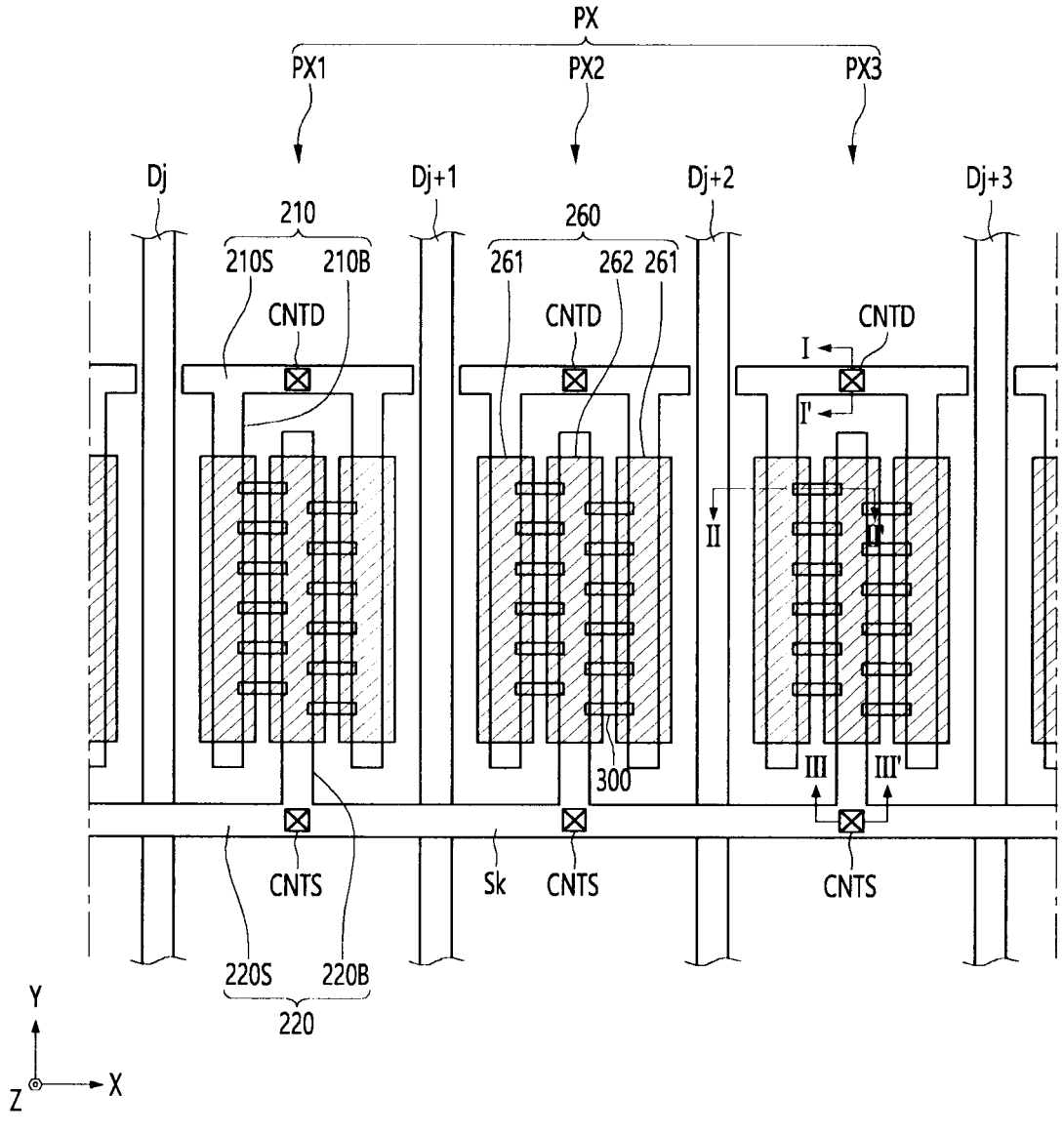

[FIG. 6]

[FIG. 7]
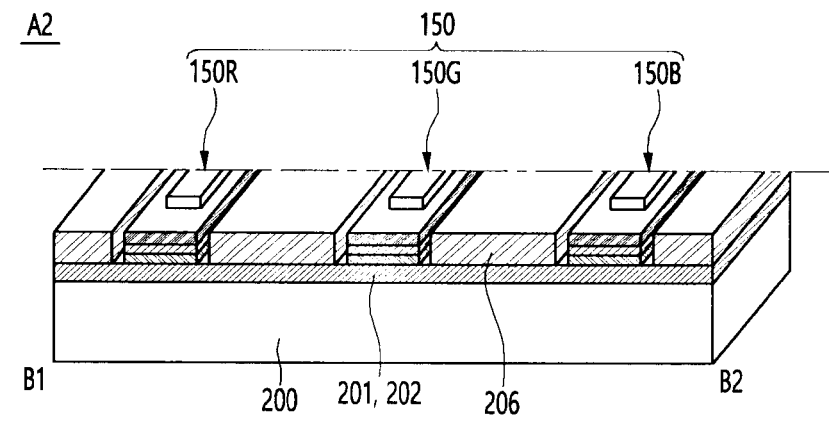
[FIG. 8]
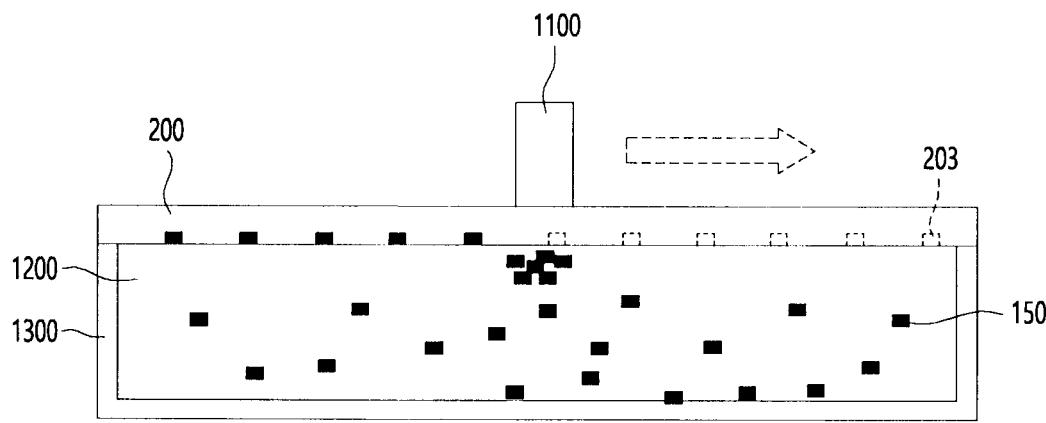

[FIG. 9]
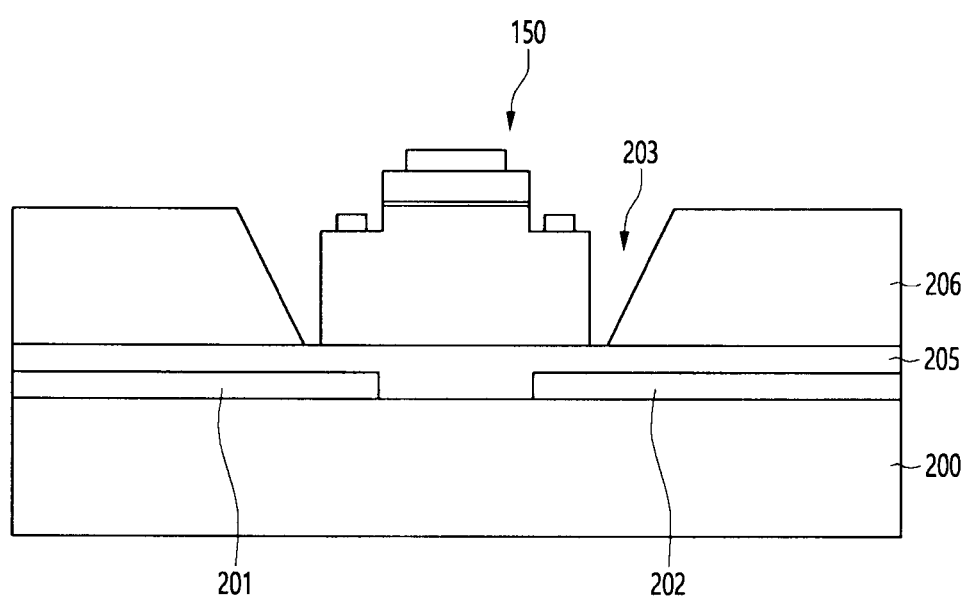
[FIG. 10]
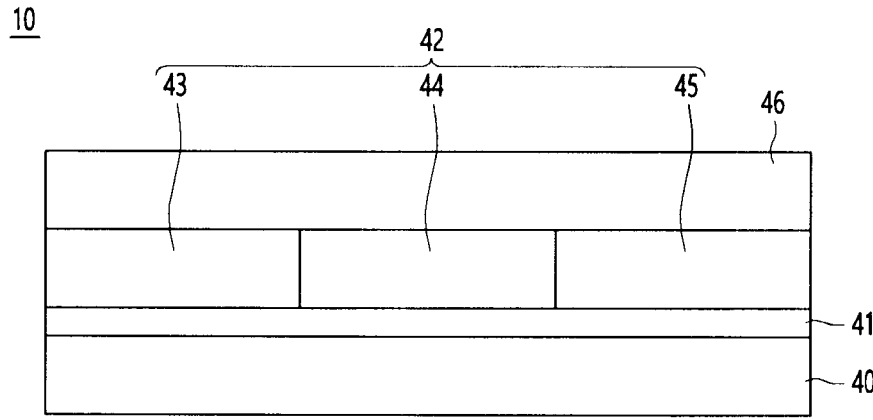

[FIG. 11]
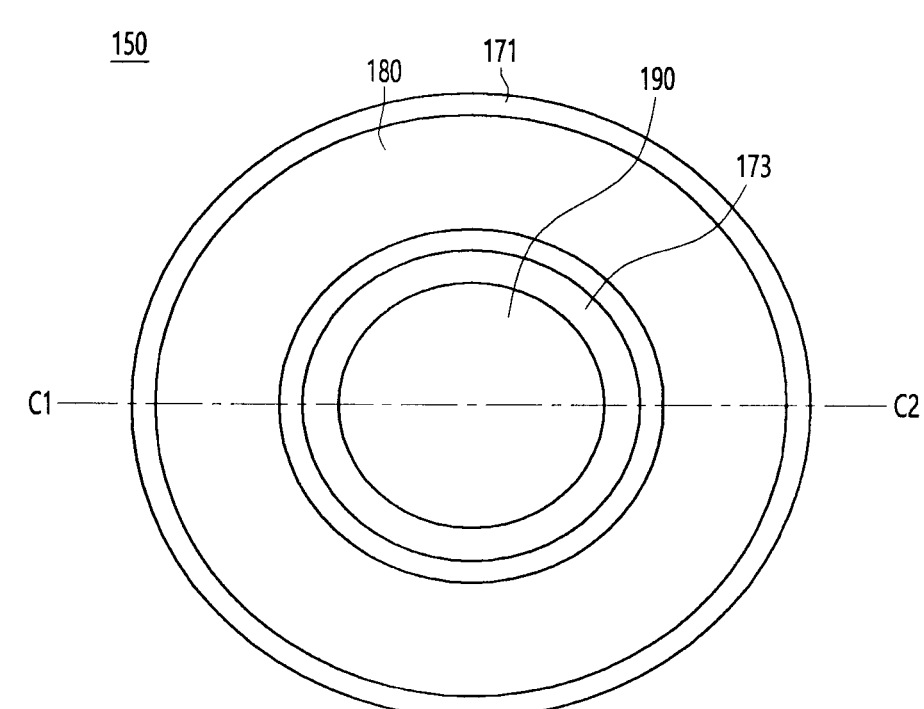

[FIG. 12]
150
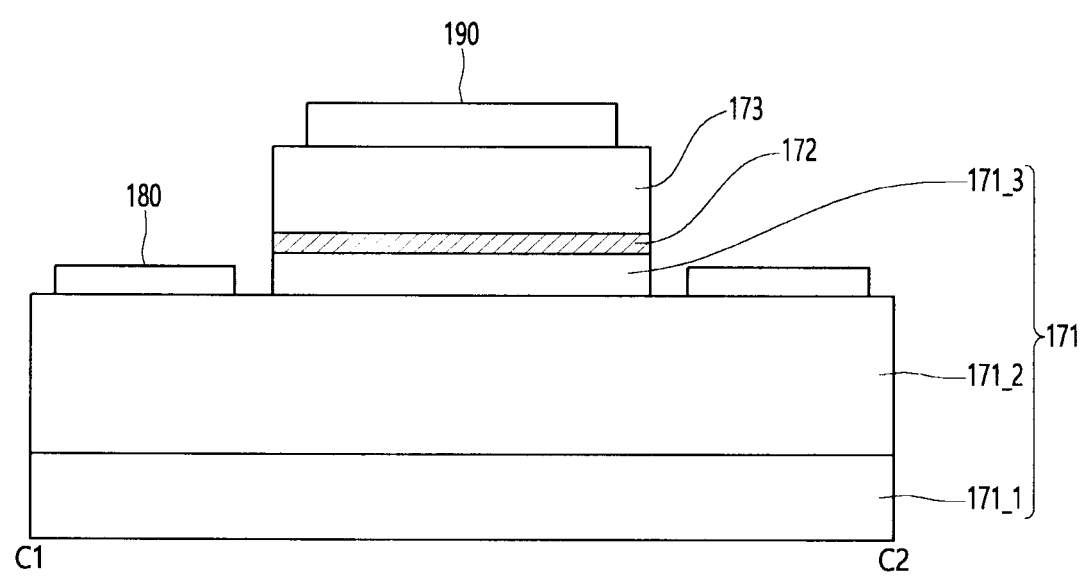

[FIG. 13A]
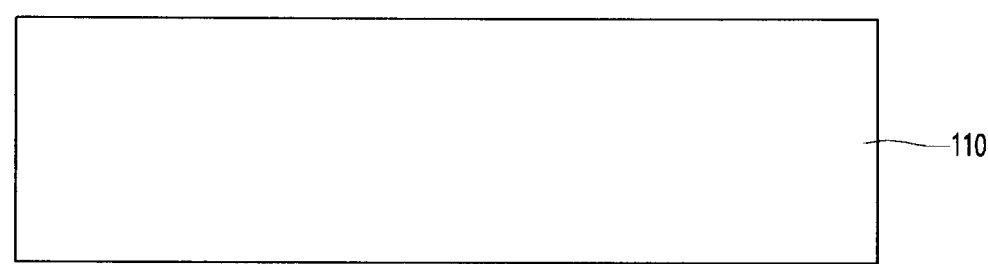
—110
[FIG. 13B]
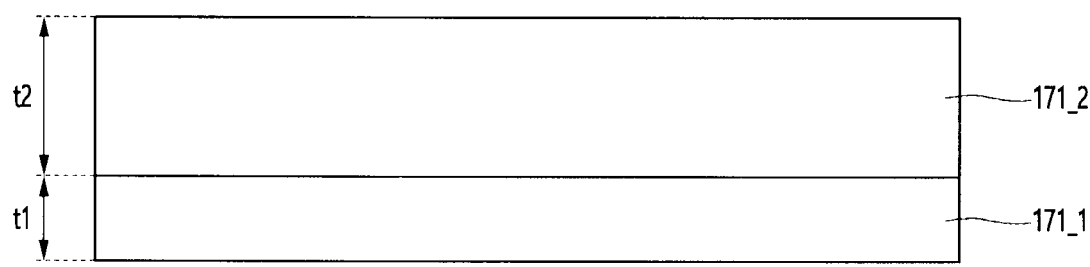
t2 —171_2
t1 —171_1

[FIG. 14A]
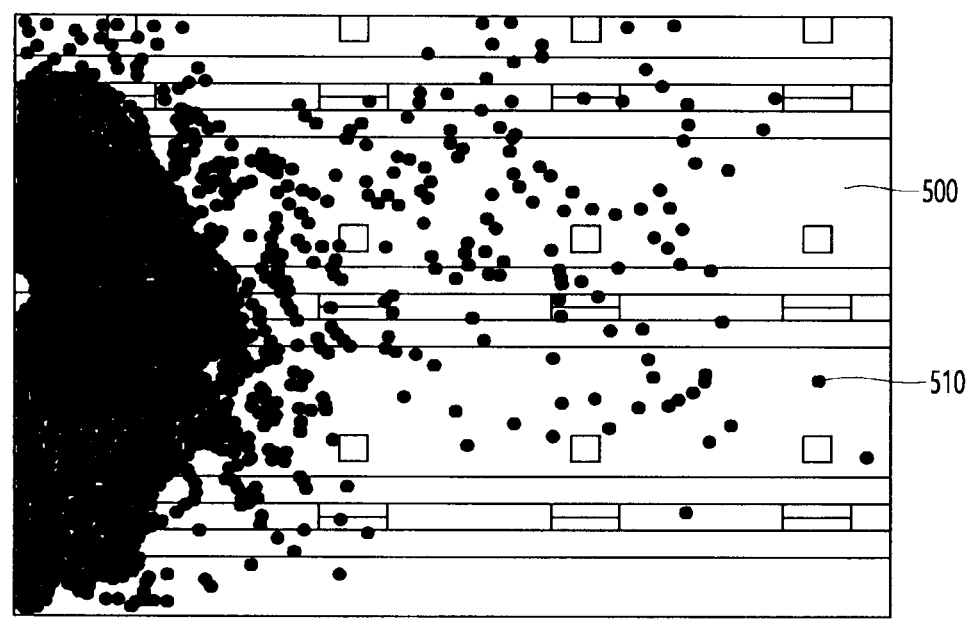
[FIG. 14B]
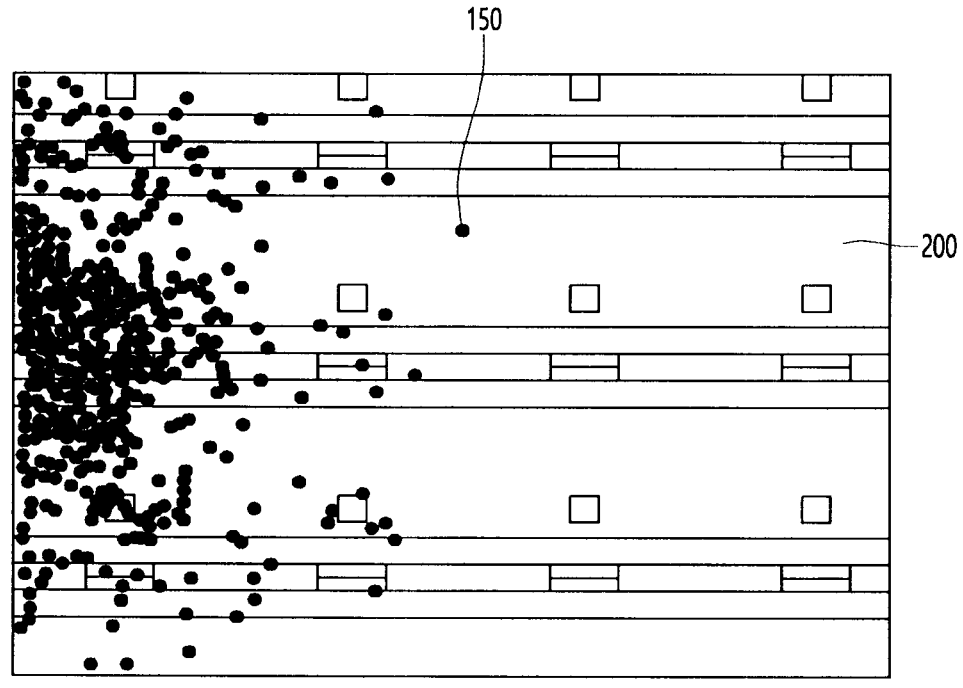

[FIG. 15]
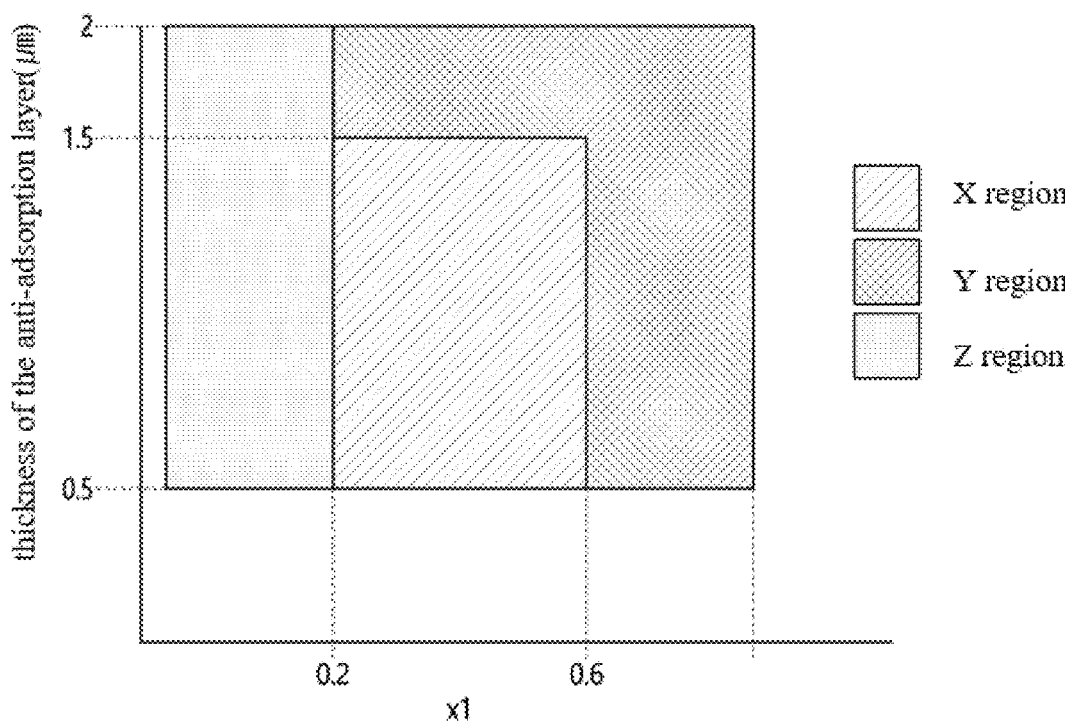

[FIG. 16]
150A
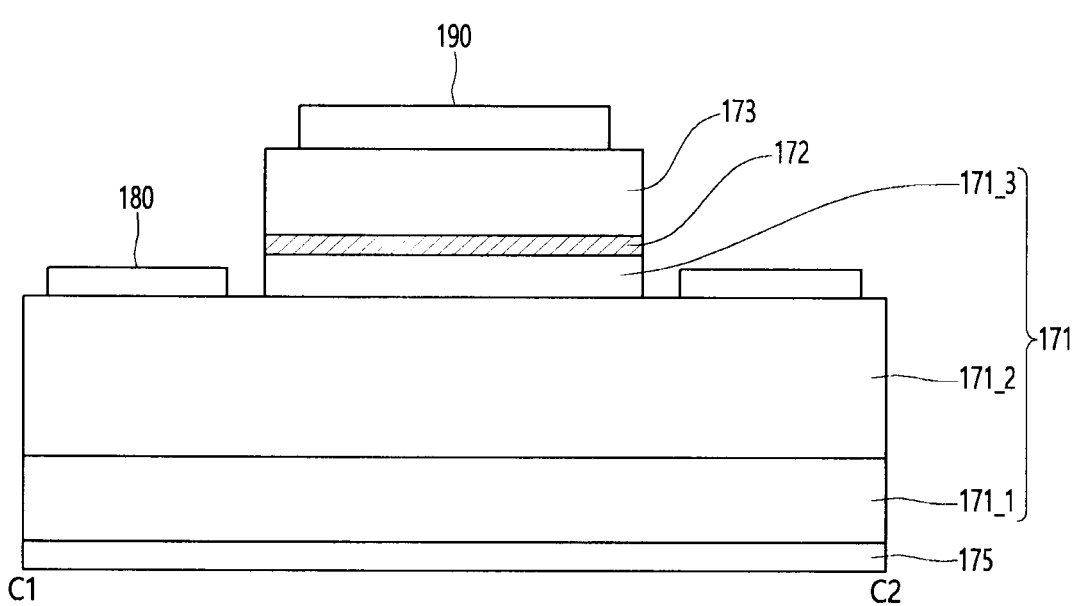

[FIG. 17]
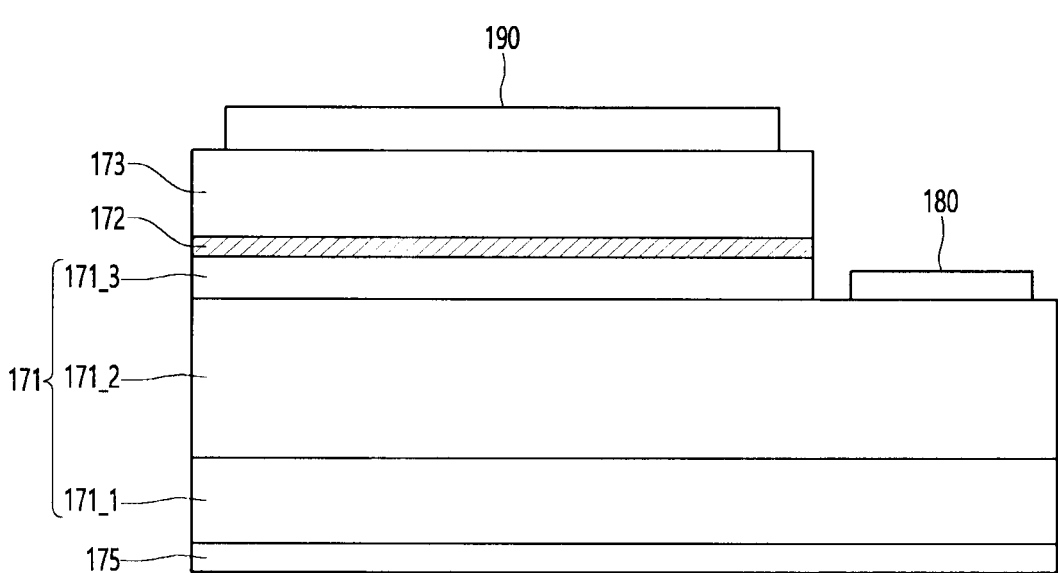

LIGHT-EMITTING ELEMENT AND DISPLAY DEVICE COMPRISING SAME

CROSS REFERENCE TO RELATED APPLICATIONS

This application is the National Phase of PCT International Application No. PCT/KR2020/016821, filed on Nov. 25, 2020, which is hereby expressly incorporated by reference into the present application.

TECHNICAL FIELD

Embodiment relates to a light emitting device and a display device including the same.

BACKGROUND ART

A display device uses a self-light emitting device such as a light emitting diode as a light source of a pixel to display a high-definition image. Light emitting diodes exhibit excellent durability even under harsh environmental conditions, and are in the limelight as a light source for next-generation display devices because of their long lifespan and high luminance.

Recently, research is being conducted to manufacture a subminiature light emitting diode using a material having a highly reliable inorganic crystal structure and to use it as a next-generation pixel light source by placing it on a panel of a display device (hereinafter referred to as "display panel").

In order to implement high resolution, the size of pixels is gradually getting smaller, and since a large number of light emitting devices should be aligned in such small-sized pixels, research into the manufacture of ultra-small light emitting diodes as small as micro or nano scale is being actively conducted.

A typical display panel includes millions of pixels. Therefore, since it is very difficult to align light emitting devices in each of millions of small-sized pixels, various studies on arranging light emitting devices in a display panel are being actively conducted.

As the size of light emitting devices decreases, transferring these light emitting devices onto a substrate has emerged as a very important problem. Transfer technologies that have recently been developed include a pick and place process, a laser lift-off method, or a self-assembly method. In particular, a self-assembly method in which a light emitting device is transferred onto a substrate using a magnetic material has recently been in the limelight.

However, during a self-assembly process using a magnetic material, a light emitting device is not assembled at a predetermined site of the substrate and sticks to the bottom surface of the substrate, resulting in a problem in that the assembly rate is significantly reduced. Since the light emitting device attached to the bottom surface of the substrate is not moved by the magnetic material, it is not assembled to a designated site on the substrate. The assemblage rate is the ratio of the number of light emitting devices assembled to the corresponding site out of the predetermined number of sites of the substrate.

Therefore, there is an urgent need for research and development to improve the assembly rate by preventing the light emitting device from sticking to the bottom surface of the substrate during the self-assembly process.

DISCLOSURE

Technical Problem

Embodiments are aimed at solving the above and other problems.

Another object of the embodiment is to provide a light emitting device that does not stick to the bottom surface of a substrate.

Another object of the embodiment is to provide a display device capable of improving the assembly rate by performing self-assembly using light emitting devices that do not stick to the bottom surface of a substrate.

Another object of the embodiment is to provide a display device capable of dramatically improving the self-assembly speed by performing self-assembly using a light emitting device that does not stick to the bottom surface of a substrate.

Another object of the embodiment is to provide a display device capable of securing high luminance by improving light efficiency by performing self-assembly using a light emitting device that does not stick to the bottom surface of a substrate.

Technical Solution

According to one aspect of the embodiment to achieve the above or other object, the light emitting device includes an active layer; a plurality of first conductivity-type semiconductor layers under the active layer; and a plurality of second conductivity-type semiconductor layers on the active layer. The plurality of first conductivity-type semiconductor layers include an adsorption prevention layer spaced farthest from the active layer. The adsorption prevention layer can include $Al_{x1}Ga_{(1-x1)}InP$, x1 can be 0.6 or less, and the thickness of the adsorption prevention layer can be 2 μm or less. With the structure of the embodiment as described above, the assemblage rate is improved, the light efficiency is improved, and high luminance can be secured.

Effects of the Invention

Effects of the light emitting device and the display device including the light emitting device according to the embodiment are described as follows.

According to at least one of the embodiments, in a light emitting device including a first conductivity-type semiconductor layer, an active layer, and a second conductivity-type semiconductor layer, by providing an adsorption prevention layer on the first conductivity-type semiconductor layer, it is possible to prevent the light emitting devices from adsorbing to the bottom surface of the substrate during self-assembly. Accordingly, the light emitting devices can be assembled at each predetermined site instead of being adsorbed to the bottom surface of the substrate, and the assembly rate can be remarkably improved. In this way, as the assembly ratio is improved, the number of light emitting devices included in each sub-pixel is increased, so that not only light efficiency is improved, but also high luminance can be implemented.

According to at least one of the embodiments, in a light emitting device including a first conductivity-type semiconductor layer, an active layer, and a second conductivity-type semiconductor layer, by providing a shielding layer capable of shielding the Al electrical conductivity of the first conductivity-type semiconductor layer under the first conductivity-type semiconductor layer, adsorption of the light emitting device to the bottom surface of the substrate can be prevented by negative (−) charge due to Al electrical conductivity of the first conductivity-type semiconductor layer. Accordingly, the light emitting devices can be assembled at each predetermined site instead of being adsorbed to the bottom surface of the substrate, and the assembly rate can be remarkably improved. In this way, as the assembly ratio is improved, the number of light emitting devices included in each sub-pixel is increased, so that not only light efficiency is improved, but also high luminance can be implemented.

According to at least one of the embodiments, in a light emitting device including a first conductivity-type semiconductor layer, an active layer, and a second conductivity-type semiconductor layer, by having a circular structure in which the first electrode disposed on the first conductivity-type semiconductor layer surrounds the second electrode disposed on the second conductivity-type semiconductor layer, a current can uniformly flow from the second electrode to the first electrode along a radial direction via the second conductivity-type semiconductor layer, the active layer, and the first conductivity-type semiconductor layer. Accordingly, since electrons in the entire region of the first conductivity-type semiconductor layer are injected into the active layer and contribute to light emission, light emission efficiency can be improved.

A further scope of applicability of the embodiment will become apparent from the detailed description below. However, since various changes and modifications within the spirit and scope of the embodiments can be clearly understood by those skilled in the art, it should be understood that the detailed description and specific embodiments, such as preferred embodiments, are given by way of example only.

DESCRIPTION OF DRAWINGS

FIG. 1 shows a living room of a house in which a display device 100 according to an embodiment is disposed.

FIG. 2 is a schematic block diagram of a display device according to an exemplary embodiment.

FIG. 3 is a circuit diagram showing an example of a pixel of FIG. 2.

FIG. 4 is a plan view showing the display panel of FIG. 2 in detail.

FIG. 5 is a plan view showing pixels in the display area of FIG. 4 in detail.

FIG. 6 is an enlarged view of the first panel area in the display device of FIG. 1.

FIG. 7 is an enlarged view of area A2 of FIG. 6.

FIG. 8 is a view showing an example in which a light emitting device according to an embodiment is assembled to a substrate by a self-assembly method.

FIG. 9 shows a state in which a light emitting device is inserted into a substrate by the self-assembly method shown in FIG. 8.

FIG. 10 is a schematic cross-sectional view of the display panel of FIG. 2.

FIG. 11 is a plan view showing a light emitting device according to the first embodiment.

FIG. 12 is a cross-sectional view showing a light emitting device according to the first embodiment.

FIG. 13A shows a portion of the first conductivity-type semiconductor layer according to the comparative example, and FIG. 13B shows a portion of the first conductivity-type semiconductor layer in the light emitting device according to the first embodiment.

FIG. 14A shows a light emitting device attached to the bottom surface of a substrate during self-assembly in Comparative Example, and FIG. 14B shows a light emitting device attached to the bottom surface of a substrate during self-assembly in the first embodiment.

FIG. 15 shows the assembly and adsorption characteristics according to the Al content of the adsorption prevention layer and the thickness of the adsorption prevention layer.

FIG. 16 is a cross-sectional view showing a light emitting device according to a second embodiment.

FIG. 17 is a cross-sectional view showing a light emitting device according to a third embodiment.

MODE FOR INVENTION

Hereinafter, preferred embodiments of the present invention will be described in detail with reference to the accompanying drawings. However, the technical idea of the present invention is not limited to some of the described embodiments and can be implemented in various different forms, within the scope of the technical idea of the present invention, one or more of the components can be selectively combined or replaced between embodiments. Also, terms (including technical and scientific terms) used in the embodiments of the present invention, unless specifically defined and described, can be interpreted in a meaning that can be generally understood by those skilled in the art to which the present invention belongs, commonly used terms, such as terms defined in a dictionary, can be interpreted in consideration of contextual meanings of related technologies. Also, terms used in the embodiments of the present invention are for describing the embodiments and are not intended to limit the present invention. In this specification, the singular form can also include the plural form unless otherwise specified in the phrase, in the present specification, when described as "at least one (or one or more) of B and (and) C", one or more of all combinations that can be combined with A, B, and C can be included. Also, terms such as first, second, A, B, (a), and (b) can be used to describe components of an embodiment of the present invention. These terms are only used to distinguish the component from other components, and the term is not limited to the nature, order, or order of the corresponding component. And, if a component is described as being 'connected', 'coupled' or 'connected' to another component, not only when the component is directly connected, coupled or connected to the other component, it can also include cases where the component is 'connected', 'combined' or 'connected' due to another component between the component and the other component. Also, when it is described as being formed or disposed "on above or below" of each component, top (above) or bottom includes not only a case where two components are in direct contact with each other, but also a case where one or more other components are formed or disposed between the two components. Also, when expressed as "up (up) or down (down)", it can include the meaning of not only the upward direction but also the downward direction based on one component.

The display device described in this specification can include a mobile phone, a smart phone, a laptop computer, a Digital broadcasting terminal, a personal digital assistant (PDA), a portable multimedia player (PMP), a navigation, a slate PC, a tablet PC, an ultra-book, a digital TV, a desktop computer, etc. However, the configuration according to the embodiment described in the present specification can be applied to a device capable of displaying even a new product form to be developed later.

Hereinafter, a light emitting device according to an embodiment and a display device including the light emitting device will be described.

FIG. 1 illustrates a living room of a house in which a display device 100 according to an embodiment is disposed.

The display device 100 of the embodiment can display the status of various electronic products such as the washing machine 10, the robot cleaner 20, and the air purifier 30 and can communicate with each electronic product based on IOT and can control each electronic product based on user's setting data.

The display device 100 according to the embodiment can include a flexible display fabricated on a thin and flexible substrate. The flexible display can be bent or rolled like paper while maintaining characteristics of a conventional flat panel display.

In the flexible display, visual information can be implemented by independently controlling light emission of unit pixels arranged in a matrix form. The unit pixel means a minimum unit for implementing one color. A unit pixel of the flexible display can be implemented by a semiconductor light emitting device. In the embodiment, the semiconductor light emitting device can be a Micro-LED, but is not limited thereto.

FIG. 2 is a block diagram schematically illustrating a display device according to an exemplary embodiment, and FIG. 3 is a circuit diagram illustrating an example of a pixel of FIG. 2.

Referring to FIGS. 2 and 3, the display device according to the embodiment can include a display panel 10, a driving circuit 20, a scan driving unit 30, and a power supply circuit 50.

Specifically, the display device 100 can drive a clock in an active matrix (AM) method or a passive matrix (PM) method.

The driving circuit 20 can include a data driver 21 and a timing controller 22.

The display panel 10 can have a rectangular shape on a plane. The planar shape of the display panel 10 is not limited to a rectangle, and can be formed into other polygonal, circular or elliptical shapes. At least one side of the display panel 10 can be formed to be bent with a predetermined curvature.

The display panel 10 can be divided into a display area DA and a non-display area NDA disposed around the display area DA. The display area DA is an area in which pixels PX are formed to display an image. The display panel 10 can include data lines (D1 to Dm, m is an integer greater than or equal to 2), scan lines crossing the data lines D1 to Dm (S1 to Sn, n is an integer greater than or equal to 2), the high-potential voltage line VDDL supplied with the high-voltage, the low-potential voltage line VSSL supplied with the low-potential voltage, and the pixels PX connected to the data lines D1 to Dm and the scan lines S1 to Sn can be included.

Each of the pixels PX can include a first sub-pixel PX1, a second sub-pixel PX2, and a third sub-pixel PX3. The first sub-pixel PX1 can emit a first color light, the second sub-pixel PX2 can emit a second color light, and the third sub-pixel PX3 can emit a third color light. The first color light can be red light, the second color light can be green light, and the third color light can be blue light, but is not limited thereto. Also, although it is illustrated that each of the pixels PX can include three sub-pixels in FIG. 2, the present invention is not limited thereto. That is, each of the pixels PX can include four or more sub-pixels.

Each of the first sub-pixel PX1, the second sub-pixel PX2, and the third sub-pixel PX3 can connected to at least one of the data lines D1 to Dm, and at least one of the scan lines S1 to Sn, and a high potential voltage line VDDL. As shown in FIG. 3, the first sub-pixel PX1 can include the light emitting devices LD, plurality of transistors for supplying current to the light emitting devices LD, and at least one capacitor.

Each of the light emitting devices LD can be an inorganic light emitting diode including a first electrode, an inorganic semiconductor, and a second electrode. Here, the first electrode can be an anode electrode, and the second electrode can be a cathode electrode.

The plurality of transistors as shown in FIG. 3 can include a driving transistor DT for supplying current to the light emitting devices LD, and a scan transistor ST for supplying a data voltage to the gate electrode of the driving transistor DT. The driving transistor DT can include a gate electrode connected to the source electrode of the scan transistor ST, a source electrode connected to a high potential voltage line VDDL to which a high potential voltage is applied, and a drain electrode connected to first electrodes of the light emitting devices LD. The scan transistor ST can include a gate electrode connected to the scan line Sk, where k is an integer satisfying $1 \leq k \leq n$, a source electrode connected to the gate electrode of the driving transistor DT, and a drain electrode connected to data lines Dj, where j is integer satisfying $1 \leq j \leq m$.

The capacitor Cst is formed between the gate electrode and the source electrode of the driving transistor DT. The storage capacitor Cst stores a difference voltage between the gate voltage and the source voltage of the driving transistor DT.

The driving transistor DT and the scan transistor ST can be formed of a thin film transistor. Also, although the driving transistor DT and the scan transistor ST have been mainly described in FIG. 3 as being formed of a P-type MOSFET (Metal Oxide Semiconductor Field Effect Transistor), the present invention is not limited thereto. The driving transistor DT and the scan transistor ST can be formed of an N-type MOSFET. In this case, the positions of the source electrode and the drain electrode of each of the driving transistor DT and the scan transistor ST can be changed.

Also, in FIG. 3 has been illustrated each of the first sub-pixel PX1, the second sub-pixel PX2, and the third sub-pixel PX3 can include one driving transistor DT, one scan transistor ST, and 2T1C (2 Transistor-1 capacitor) having a capacitor Cst, but the present invention is not limited thereto. Each of the first sub-pixel PX1, the second sub-pixel PX2, and the third sub-pixel PX3 can include a plurality of scan transistors ST and a plurality of capacitors Cst.

Since the second sub-pixel PX2 and the third sub-pixel PX3 can be expressed with substantially the same circuit diagram as the first sub-pixel PX1, a detailed description thereof will be omitted.

The driving circuit 20 outputs signals and voltages for driving the display panel 10. To this end, the driving circuit 20 can include a data driver 21 and a timing controller 22.

The data driver 21 receives digital video data DATA and a source control signal DCS from the timing controller 22. The data driver 21 converts the digital video data DATA into analog data voltages according to the source control signal DCS and supplies them to the data lines D1 to Dm of the display panel 10.

The timing controller 22 receives digital video data DATA and timing signals from the host system. The timing signals can include a vertical sync signal, a horizontal sync signal, a data enable signal, and a dot clock. The host system can be an application processor of a smartphone or tablet PC, a monitor, or a system-on-chip of a TV.

The timing controller 22 generates control signals for controlling operation timings of the data driver 21 and the scan driver 30. The control signals can include a source control signal DCS for controlling the operation timing of the data driver 21 and a scan control signal SCS for controlling the operation timing of the scan driver 30.

The driving circuit 20 can be disposed in the non-display area NDA provided on one side of the display panel 10. The driving circuit 20 can be formed of an integrated circuit (IC) and mounted on the display panel 10 using a chip on glass (COG) method, a chip on plastic (COP) method, or an ultrasonic bonding method, but the present invention is not limited to this. For example, the driving circuit 20 can be mounted on a circuit board (not shown) instead of the display panel 10.

The data driver 21 is mounted on the display panel 10 using a chip on glass (COG) method, a chip on plastic (COP) method, or an ultrasonic bonding method, and the timing controller 22 can be mounted on a circuit board.

The scan driver 30 receives the scan control signal SCS from the timing controller 22. The scan driver 30 generates scan signals according to the scan control signal SCS and supplies them to the scan lines S1 to Sn of the display panel 10. The scan driver 30 can include a plurality of transistors and can be formed in the non-display area NDA of the display panel 10. Also, the scan driver 30 can be formed of an integrated circuit, and in this case, can be mounted on a gate flexible film attached to the other side of the display panel 10.

The circuit board can be attached to pads provided on one edge of the display panel 10 using an anisotropic conductive film. Due to this, the lead lines of the circuit board can be electrically connected to the pads. The circuit board can be a flexible printed circuit board, a printed circuit board, or a flexible film such as a chip on film. The circuit board can be bent under the display panel 10. Accordingly, one side of the circuit board can be attached to one edge of the display panel 10 and the other side can be disposed below the display panel 10 and connected to a system board on which a host system is mounted.

The power supply circuit 50 can generate voltages necessary for driving the display panel 10 from the main power applied from the system board and supply them to the display panel 10. For example, the power supply circuit 50 generates a high potential voltage VDD and a low potential voltage VSS for driving the light emitting devices LD of the display panel 10 from the main power supply, and can supply the high potential voltage line VDDL and the low potential voltage line VS SL of the display panel 10. Also, the power supply circuit 50 can generate and supply driving voltages for driving the driving circuit 20 and the scan driving unit 30 from the main power.

FIG. 4 is a plan view showing the display panel of FIG. 2 in detail. In FIG. 4, only data pads (DP1 to DPp, where p is an integer equal to or greater than 2), floating pads FD1 and FD2, power pads PP1 and PP2, floating lines FL1 and FL2, low potential voltage line VSSL, data lines D1 to Dm, first pad electrodes 210 and second pad electrodes 220 are shown for convenience of description.

Referring to FIG. 4, data lines D1 to Dm, first pad electrodes 210, second pad electrodes 220, and pixels PX can be disposed in the display area DA of the display panel 10.

The data lines D1 to Dm can extend long in the second direction (Y-axis direction). One sides of the data lines D1 to Dm can be connected to the driving circuit 20. For this reason, the data voltages of the driving circuit 20 can be applied to the data lines D1 to Dm.

The first pad electrodes 210 can be spaced apart from each other at predetermined intervals in the first direction (X-axis direction). For this reason, the first pad electrodes 210 can not overlap the data lines D1 to Dm. Among the first pad electrodes 210, the first pad electrodes 210 disposed on the right edge of the display area DA can be connected to the first floating line FL1 in the non-display area NDA. Among the first pad electrodes 210, the first pad electrodes 210 disposed on the left edge of the display area DA can be connected to the second floating line FL2 in the non-display area NDA.

Each of the second pad electrodes 220 can extend long in the first direction (X-axis direction). For this reason, the second pad electrodes 220 can overlap the data lines D1 to Dm. Also, the second pad electrodes 220 can be connected to the low potential voltage line VSSL in the non-display area NDA. For this reason, the low potential voltage of the low potential voltage line VSSL can be applied to the second pad electrodes 220.

Each of the pixels PX can include a first sub-pixel PX1, a second sub-pixel PX2, and a third sub-pixel PX3. The first sub-pixel PX1, the second sub-pixel PX2, and the third sub-pixel PX3 of each of the pixels PX can be disposed in regions defined in a matrix form by the first pad electrodes 210, the second electrode, and the data lines D1 to Dm. Although FIG. 4 illustrates that the pixel PX includes three sub-pixels, it is not limited thereto, and each of the pixels PX can include four or more sub-pixels.

The first sub-pixel PX1, the second sub-pixel PX2, and the third sub-pixel PX3 of each of the pixels PX can be disposed in the first direction (X-axis direction), but is not limited thereto. That is, the first sub-pixel PX1, the second sub-pixel PX2, and the third sub-pixel PX3 of each of the pixels PX can be disposed in the second direction (Y-axis direction), can be disposed in a zigzag shape, or can be disposed in various other shapes.

The first sub-pixel PX1 emits light of a first color, the second sub-pixel PX2 emits light of a second color, and third sub-pixel PX3 can emit third color light. The first color light can be red light, the second color light can be green light, and the third color light can be blue light, but are not limited thereto.

In the non-display area NDA of the display panel 10, a pad part PA including data pads DP1 to DPp, floating pads FD1 and FD2, power pads PP1 and PP2, the driving circuit 20, the first floating line FL1, the second floating line FL2, and the low potential voltage line VSSL can be disposed.

The pad part PA including data pads DP1 to DPp, floating pads FD1 and FD2, and power pads PP1 and PP2 can be disposed on one edge of the display panel 10, for example, on the lower edge. The data pads DP1 to DPp, the floating pads FD1 and FD2, and the power pads PP1 and PP2 can be disposed side by side in the first direction (X-axis direction) of the pad part PA.

A circuit board can be attached to the data pads DP1 to DPp, the floating pads FD1 and FD2, and the power pads PP1 and PP2 using an anisotropic conductive film. Accordingly, the circuit board, the data pads DP1 to DPp, the floating pads FD1 and FD2, and the power pads PP1 and PP2 can be electrically connected.

The driving circuit 20 can be connected to the data pads DP1 to DPp through the link lines LL. The driving circuit 20 can receive digital video data DATA and timing signals through the data pads DP1 to DPp. The driving circuit 20 can convert the digital video data DATA into analog data voltages and supply them to the data lines D1 to Dm of the display panel 10.

The low potential voltage line VS SL can be connected to the first power pad PP1 and the second power pad PP2 of the pad part PA. The low potential voltage line VS SL can extend long in the second direction (Y-axis direction) in the non-display area NDA outside the left and right outside of the display area DA. The low potential voltage line VSSL can be connected to the second pad electrode 220. Due to this, the low potential voltage of the power supply circuit 50 can be applied to the second pad electrode 220 through the circuit board, the first power pad PP1, the second power pad PP2, and the low potential voltage line VSSL.

The first floating line FL1 can be connected to the first floating pad FD1 of the pad part PA. The first floating line FL1 can extend long in the second direction (Y-axis direction) in the non-display area NDA outside the left and right sides of the display area DA.

The first floating pad FD1 and the first floating line FL1 can be dummy pads and dummy lines to which no voltage is applied.

The second floating line FL2 can be connected to the second floating pad FD2 of the pad part PA. The first floating line FL1 can extend long in the second direction (Y-axis direction) in the non-display area NDA outside the left and right sides of the display area DA.

The second floating pad FD2 and the second floating line FL2 can be dummy pads and dummy lines to which no voltage is applied.

Meanwhile, since the light emitting devices (300 in FIG. 5) have a very small size, it is very difficult to mount the first sub-pixel PX1, the second sub-pixel PX2, and the third sub-pixel PX3 of the pixels PX.

To solve this problem, an alignment method using a dielectrophoresis method was proposed.

That is, during the manufacturing process, in order to align the light emitting devices 300, an electric field can be formed in each of the first sub-pixel PX1, the second sub-pixel PX2, and the third sub-pixel PX3 of the pixels PX. Specifically, the light emitting devices 300 can be aligned by applying a dielectrophoretic force to the light emitting devices 300 using a dielectrophoresis method during a manufacturing process.

However, it is difficult to apply a ground voltage to the first pad electrodes 210 by driving the thin film transistors during the manufacturing process.

Therefore, in the completed display device, the first pad electrodes 210 are spaced apart at predetermined intervals in the first direction (X-axis direction), but during the manufacturing process, the first pad electrodes 210 can not be disconnected in the first direction (X-axis direction) and can be extended and disposed.

For this reason, during the manufacturing process, the first pad electrodes 210 can be connected to the first floating line FL1 and the second floating line FL2. Therefore, the first pad electrodes 210 can receive a ground voltage through the first floating line FL1 and the second floating line FL2. Therefore, after aligning the light emitting devices 300 using a dielectrophoresis method during the manufacturing process, by disconnecting the first pad electrodes 210, the first pad electrodes 210 can be spaced apart from each other at predetermined intervals in the first direction (X-axis direction).

Meanwhile, the first floating line FL1 and the second floating line FL2 are lines for applying a ground voltage during a manufacturing process, and no voltage can be applied in a completed display device. Alternatively, a ground voltage can be applied to the first floating line FL1 and the second floating line FL2 to prevent static electricity in the finished display device.

FIG. 5 is a plan view showing pixels in the display area of FIG. 4 in detail.

Referring to FIG. 5, the pixel PX can include a first sub-pixel PX1, a second sub-pixel PX2, and a third sub-pixel PX3. The first sub-pixel PX1, the second sub-pixel PX2, and the third sub-pixel PX3 of each of the pixels PX can be arranged in a matrix form in regions defined by an intersection structure of scan lines Sk and data lines Dj, Dj+1, Dj+2, and Dj+3.

The scan lines (Sk) are disposed to extend long in the first direction (X-axis direction). The data lines Dj, Dj+1, Dj+2, and Dj+3 can be disposed to extend in a second direction (Y-axis direction) crossing the first direction (X-axis direction).

Each of the first sub-pixel PX1, the second sub-pixel PX2, and the third sub-pixels PX3 can include a first pad electrode 210, a second pad electrode 220 and a plurality of light emitting devices 300. The first pad electrode 210 and the second pad electrode 220 can be electrically connected to the light emitting devices 300 and can receive voltages so that the light emitting devices 300 emit light.

The first pad electrode 210 of any one of the first sub-pixel PX1, the second sub-pixel PX2, and the third sub-pixel PX3 can be spaced apart from the first pad electrode 210 of an adjacent sub-pixel. For example, the first pad electrode 210 of the first sub-pixel PX1 can be spaced apart from the first pad electrode 210 of the second sub-pixel PX2 adjacent thereto. Also, the first pad electrode 210 of the second sub-pixel PX2 can be spaced apart from the first pad electrode 210 of the third sub-pixel PX3 adjacent thereto. Also, the first pad electrode 210 of the third sub-pixel PX3 can be spaced apart from the first pad electrode 210 of the first sub-pixel PX1 adjacent thereto.

On the other hand, the second pad electrode 220 of any one of the first sub-pixel PX1, the second sub-pixel PX2, and the third sub-pixel PX3 can be connected to the second pad electrode 220 of an adjacent sub-pixel. For example, the second pad electrode 220 of the first sub-pixel PX1 can be connected to the second electrode 210 of the adjacent second sub-pixel PX2. Also, the second pad electrode 220 of the second sub-pixel PX2 can be connected to the second pad electrode 220 of the third sub-pixel PX3 adjacent thereto. Also, the second pad electrode 220 of the third sub-pixel PX3 can be connected to the second pad electrode 220 of the first sub-pixel PX1 adjacent thereto.

Also, during the manufacturing process, the first pad electrode 210 and the second pad electrode 220 can be used to form an electric field in each of the first sub-pixel PX1, the second sub-pixel PX2, and the third sub-pixel PX3 to align the light emitting device 300. Specifically, the light emitting devices 300 can be aligned by applying a dielectrophoresis force to the light emitting devices 300 using a dielectrophoresis method during the manufacturing process. An electric field is formed by the voltage applied to the first pad electrode 210 and the second pad electrode 220, and a capacitance is formed by the electric field, so that a dielectrophoretic force can be applied to the light emitting device 300.

The first pad electrode 210 can be an anode electrode connected to the second conductivity-type semiconductor layer of the light emitting devices 300, and the second pad electrode 220 can be a cathode electrode connected to the first conductivity-type semiconductor layer of the light emitting devices 300. The first conductivity-type semiconductor layer of the light emitting devices 300 can be an n-type semiconductor layer, and the second conductivity-type semiconductor layer can be a p-type semiconductor layer. However, the present invention is not limited thereto, and the first pad electrode 210 can be a cathode electrode and the second pad electrode 220 can be an anode electrode.

The first pad electrode 210 can include a first electrode stem 210S extending and extending in a first direction (X-axis direction) and at least one first electrode branch portion 210B branched from the first electrode stem portion 210S in a second direction (Y-axis direction). The second pad electrode 220 can include a second electrode stem 220S extending and extending in the first direction (X-axis direction) and at least one second electrode branch portion 220B branched in a second direction (Y-axis direction) from the second electrode stem portion 220S.

The first electrode stem portion 210S can be electrically connected to the thin film transistor 120 through the first electrode contact hole CNTD.

Due to this, the first electrode stem 210S can be applied with a predetermined driving voltage by the thin film transistor 120. The thin film transistor 120 to which the first electrode stem 210S is connected can be the driving transistor DT shown in FIG. 3.

The second electrode stem 220S can be electrically connected to the low potential auxiliary wire 161 through the second electrode contact hole CNTS.

Due to this, the second electrode stem portion 220S can receive the low potential voltage of the low potential auxiliary wire 161. FIG. 5 illustrates that the second electrode stem 220S is connected to the low potential auxiliary wire 161 through the second electrode contact hole CNTS in each of the first sub-pixel PX1, the second sub-pixel PX2 and the third sub-pixels PX3 of the pixel PX, but is not limited to this. For example, the second electrode stem 220S can be connected to the low potential auxiliary wire 161 through the second electrode contact hole CNTS in any one sub-pixel among the first sub-pixel PX1, the second sub-pixel PX2, and the third sub-pixel PX3.

The first electrode stem 210S of one sub-pixel can be disposed parallel to the first electrode stem portion 210S of a neighboring sub-pixel in a first direction (X-axis direction) in a first direction (X-axis direction). For example, the first electrode stem 210S of the first sub-pixel PX1 can be disposed parallel to the first electrode stem 210S of the second sub-pixel PX2 in the first direction (X-axis direction), the first electrode stem 210S of the second sub-pixel PX2 is disposed parallel to the first electrode stem 210S of the third sub-pixel PX3 in a first direction (X-axis direction) and the first electrode stem 210S of the third sub-pixel PX3 can be disposed parallel to the first electrode stem 210S of the first sub-pixel PX1 in the first direction (X-axis direction). This is because the first electrode stems 210S were connected as one during the manufacturing process, and then disconnected through a laser process after the light emitting devices 300 were aligned.

The second electrode branch 220B can be disposed between the first electrode branch 210B. The first electrode branch portions 210B can be symmetrically disposed with respect to the first electrode branch portion 220B. In FIG. 5, each of the first sub-pixel PX1, the second sub-pixel PX2, and the third sub-pixel PX3 of the pixel PX includes two first electrode branch portions 220B, but the present invention is not limited to this. For example, each of the first sub-pixel PX1, the second sub-pixel PX2, and the third sub-pixel PX3 of the pixel PX can include three or more first electrode branches 220B.

Also, FIG. 5 illustrates that each of the first sub-pixel PX1, the second sub-pixel PX2, and the third sub-pixel PX3 of the pixel PX includes one second electrode branch 220B, but the present invention is not limited to this. For example, when each of the first sub-pixel PX1, the second sub-pixel PX2, and the third sub-pixel PX3 of the pixel PX includes a plurality of second electrode branch portions 220B. The first electrode branch 210B can be disposed between the second electrode branch 220B. That is, in each of the first sub-pixel PX1, the second sub-pixel PX2, and the third sub-pixel PX3 of the pixel PX, the first electrode branch 210B, the second electrode branch 220B, the first electrode branch 210B, and the second electrode branch 220B can be sequentially arranged in the first direction (X-axis direction).

The plurality of light emitting devices 300 can be disposed between the first electrode branch 210B and the second electrode branch 220B. One end of at least one light emitting device 300 among the plurality of light emitting devices 300 is disposed to overlap the first electrode branch 210B, and the other end is disposed to overlap the second electrode branch 220B. A second conductivity-type semiconductor layer, which is a p-type semiconductor layer, can be disposed at one end of the plurality of light emitting devices 300, and a first conductivity-type semiconductor layer, which is an n-type semiconductor layer, can be disposed at the other end, but the present invention is not limited to this. For example, a first conductivity-type semiconductor layer, which is an n-type semiconductor layer, can be disposed at one end of the plurality of light emitting devices 300, and a second conductivity-type semiconductor layer, which is a p-type semiconductor layer, can be disposed at the other end.

The plurality of light emitting devices 300 can be disposed substantially parallel to each other in the first direction (X-axis direction). The plurality of light emitting devices 300 can be spaced apart from each other in the second direction (Y-axis direction). In this case, the spacing between the plurality of light emitting devices 300 can be different from each other. For example, some of the plurality of light emitting devices 300 can be adjacently disposed to form one group, and the remaining light emitting devices 300 can be adjacently disposed to form another group.

Connection electrodes 260 can be disposed on the first electrode branch 210B and the second electrode branch 220B, respectively. The connection electrodes 260 can be disposed to extend long in the second direction (Y-axis direction) and spaced apart from each other in the first direction (X-axis direction). The connection electrode 260 can be connected to one end of at least one light emitting device 300 among the light emitting devices 300. The connection electrode 260 can be connected to the first pad electrode 210 or the second pad electrode 220.

The connection electrode 260 can include a first connection electrode 261 disposed on the first electrode branch 210B and connected to one end of at least one of the light emitting devices 300 and a second connection electrode 262 disposed on the second electrode branch 220B and connected to one end of at least one light emitting device 300 of the light emitting devices 300. Due to this, the first connection electrode 261 serves to electrically connect the plurality of light emitting devices 300 to the first pad electrode 210, and the second connection electrode 262 serves to electrically connect the plurality of light emitting devices 300 to the second pad electrode 220.

The width of the first connection electrode 261 in the first direction (X-axis direction) can be greater than the width of the first electrode branch 210B in the first direction (X-axis direction). Also, the width of the second connection electrode 262 in the first direction (X-axis direction) can be greater than the width of the second electrode branch 220B in the first direction (X-axis direction).

For example, each end of the light emitting device 300 is disposed on the first electrode branch 210B of the first pad electrode 210 and the second electrode branch 220B of the second pad electrode 220, but due to the insulating layer (not shown) formed on the first pad electrode 210 and the second pad electrode 220, the light emitting device 300 can not be electrically connected to the first pad electrode 210 and the second pad electrode 220. Accordingly, portions of the side surface and/or top surface of the light emitting device 300 can be electrically connected to the first connection electrode 261 and the second connection electrode 262, respectively.

Figure 6:
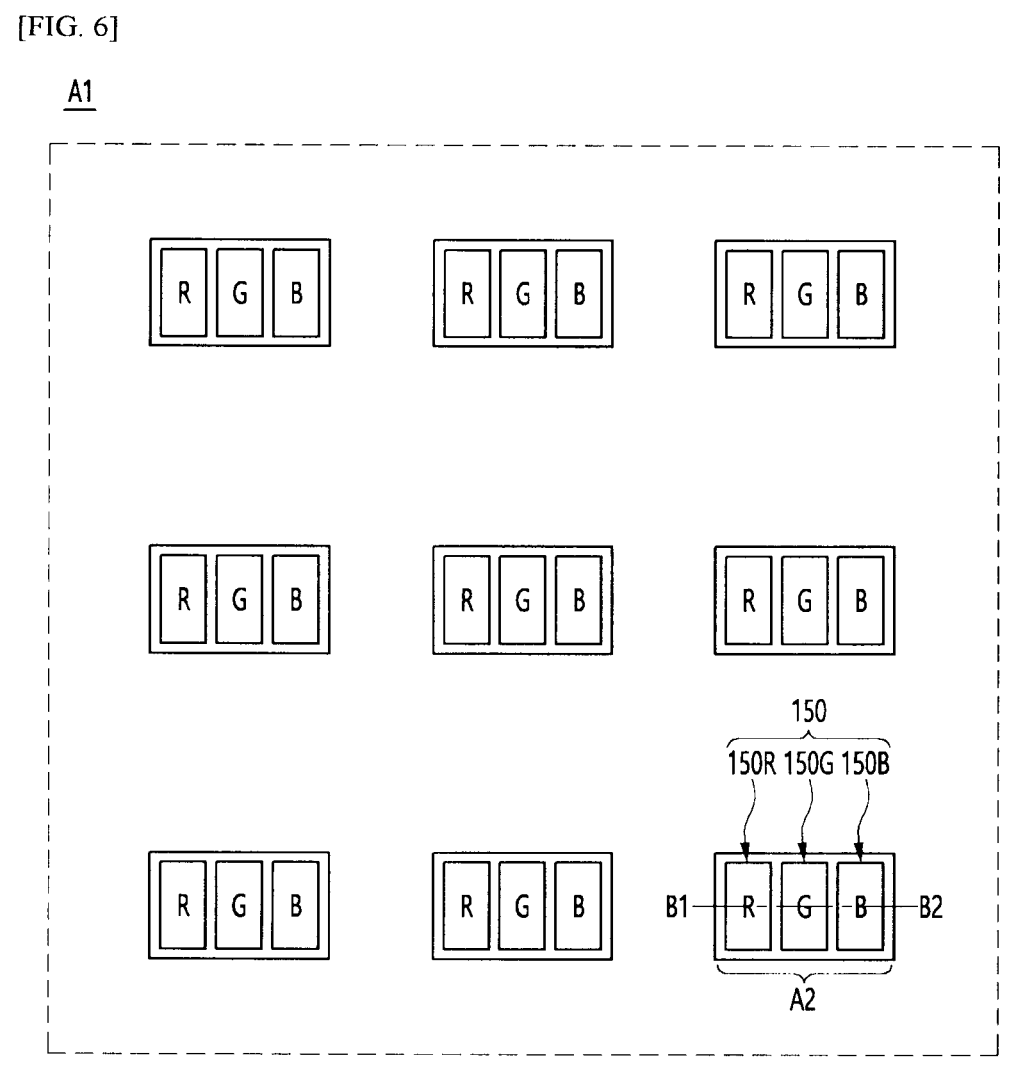

FIG. 6 is an enlarged view of a first panel area in the display device of FIG. 1.

Referring to FIG. 6, the display device 100 of the embodiment can be manufactured by mechanically and electrically connecting a plurality of panel areas such as the first panel area A1 by tiling.

The first panel area A1 can include a plurality of light emitting devices 150 arranged for each unit pixel (PX in FIG. 2). The light emitting device 150 can be the light emitting device 300 of FIG. 5.

The light emitting device 150 can include, for example, a red light emitting device 150R, a green light emitting device 150G, and a blue light emitting device 150B. For example, the unit pixel PX can include a first sub-pixel PX1, a second sub-pixel PX2, and a third sub-pixel PX3. For example, a plurality of red light emitting devices 150R are disposed in the first sub-pixel PX1, a plurality of green light emitting devices 150G can be disposed in the second sub-pixel PX2, and a plurality of blue light emitting devices 150B can be disposed in the third sub-pixel PX3. The unit pixel PX can further include a fourth sub-pixel in which no light emitting device is disposed, but is not limited thereto.

FIG. 7 is an enlarged view of area A2 of FIG. 6.

Referring to FIG. 7, a display device 100 according to an exemplary embodiment can include a substrate 200, wire electrodes 201 and 202, an insulating layer 206, and a plurality of light emitting devices 150.

The wiring electrode can include a first wiring electrode 201 and a second wiring electrode 202 spaced apart from each other.

The light emitting device 150 can include a red light emitting device 150R, a green light emitting device 150G, and a blue light emitting device 150B0 to form a sub-pixel, but is not limited thereto, and the light emitting device 150 can implement red and green colors by including a red phosphor and a green phosphor, respectively.

The substrate 200 can be formed of glass or polyimide. Also, the substrate 200 can include a flexible material such as polyethylene naphthalate (PEN) or polyethylene terephthalate (PET). Also, the substrate 200 can be a transparent material, but is not limited thereto.

The insulating layer 130 can include an insulating and flexible material such as polyimide, PEN, or PET, and can be formed integrally with the substrate 200 to form a single substrate.

The insulating layer 130 can be a conductive adhesive layer having adhesiveness and conductivity, and the conductive adhesive layer can have flexibility and thus enable a flexible function of the display device. For example, the insulating layer 130 can be an anisotropy conductive film (ACF) or a conductive adhesive layer such as an anisotropic conductive medium or a solution containing conductive particles. The conductive adhesive layer can be a layer that is electrically conductive in a direction perpendicular to the thickness but electrically insulating in a direction horizontal to the thickness.

The insulating layer 130 can include an assembly hole 203 into which the light emitting device 150 is inserted. Therefore, during self-assembly, the light emitting device 150 can be easily inserted into the assembly hole 203 of the insulating layer 130.

FIG. 8 is a diagram illustrating an example in which a light emitting device according to an embodiment is assembled to a substrate by a self-assembly method.

Referring to FIG. 8, an example in which the light emitting device 150R according to the embodiment is assembled to the substrate 200 by a self-assembly method using an electromagnetic field will be described.

In FIG. 8, the substrate 200 can be a panel substrate of a display device or a temporary donor substrate for transfer.

In the following description, the substrate 200 will be described as a panel substrate of a display device, but the embodiment is not limited thereto.

The substrate 200 can be formed of glass or polyimide. Also, the substrate 200 can include a flexible material such as polyethylene naphthalate (PEN) or polyethylene terephthalate (PET). Also, the substrate 200 can be a transparent material, but is not limited thereto.

Referring to FIG. 8, the light emitting device 150R can be put into a chamber 1300 filled with a fluid 1200. The fluid 1200 can be water such as ultrapure water, but is not limited thereto. A chamber can also be called a water bath, container, vessel, or the like.

Thereafter, the substrate 200 can be disposed on the chamber 1300. Depending on the embodiment, the substrate 200 can be introduced into the chamber 1300.

A pair of first electrodes 211 and a second electrode 212 corresponding to each of the light emitting devices 150R to be assembled can be formed on the substrate 200.

The first electrode 211 and the second electrode 212 can be formed of a transparent electrode (ITO) or can include a metal material having excellent electrical conductivity. For example, the first electrode 211 and the second electrode 212 can include at least one of titanium (Ti), chromium (Cr), nickel (Ni), aluminum (Al), platinum (Pt), gold (Au), tungsten (W), or molybdenum (Mo) or an alloy thereof.

The first electrode 211 and the second electrode 212 can function as a pair of assembly electrodes for fixing the assembled light emitting device 150R to the assembly hole 203 on the substrate 200 by emitting an electric field as voltage is applied thereto.

The distance between the first electrode 211 and the second electrode 212 is smaller than the width of the light emitting device 150R and the width of the assembly hole 203, the assembly position of the light emitting device 150R using an electric field can be more accurately fixed.

An insulating layer 220 is formed on the first electrode 211 and the second electrode 212, the first electrode 211 and the second electrode 212 can be protected from the fluid 1200 and current flowing through the first electrode 211 and the second electrode 212 can be prevented from leaking. The insulating layer 220 can be formed of a single layer or multiple layers of an inorganic insulator such as silica or alumina or an organic insulator.

Also, the insulating layer 220 can include an insulating and flexible material such as polyimide, PEN, or PET, and can be formed integrally with the substrate 200 to form a single substrate.

The insulating layer 220 can be an adhesive insulating layer or a conductive adhesive layer having conductivity. Since the insulating layer 220 is flexible, it can enable a flexible function of the display device.

A barrier wall 200S can be formed on an upper portion of the insulating layer 220. A partial region of the barrier wall 200S can be located above the first electrode 211 and the second electrode 212.

For example, when the substrate 200 is formed, some of the barrier walls formed on the insulating layer 220 can be removed to form assembly holes 203 in which each of the light emitting devices 150R is assembled to the substrate 200. A second pad electrode 222 can be formed between the barrier wall 200S and the insulating layer 220 to apply power to the light emitting device 150R.

An assembly hole 203 to which the light emitting devices 150R are coupled is formed in the substrate 200, and a surface on which the assembly hole 203 is formed can contact the fluid 1200. The assembly hole 203 can guide an accurate assembly position of the light emitting device 150R.

Meanwhile, the assembly hole 203 can have a shape and size corresponding to the shape of the light emitting device 150R to be assembled at the corresponding position. Accordingly, it is possible to prevent assembling another light emitting device or assembling a plurality of light emitting devices into the assembly hole 203.

Referring back to FIG. 8, after the substrate 200 is disposed, the assembly device 1100 including the magnetic material can move along the substrate 200. As the magnetic material, for example, a magnet or an electromagnet can be used. The assembly device 1100 can move while in contact with the substrate 200 in order to maximize the area of the magnetic field into the fluid 1200. Depending on the embodiment, the assembly device 1100 can include a plurality of magnetic bodies or can include a magnetic body having a size corresponding to that of the substrate 200. In this case, the moving distance of the assembling device 1100 can be limited within a predetermined range.

The light emitting device 150R in the chamber 1300 can move toward the assembly device 1100 by the magnetic field generated by the assembly device 1100.

While moving toward the assembly device 1100, the light emitting device 150R can enter the assembly hole 203 and come into contact with the substrate 200.

At this time, by the electric field applied by the first electrode 211 and the second electrode 212 formed on the substrate 200, the light emitting device 150R in contact with the substrate 200 can be prevented from being separated by the movement of the assembly device 1100.

That is, since the time required for assembling each of the light emitting devices 150R to the substrate 200 can be drastically reduced by the above-described self-assembly method using the electromagnetic field, a large-area high-pixel display can be implement more quickly and economically.

A predetermined solder layer 225 is further formed between the light emitting device 150R assembled on the assembly hole 203 of the substrate 200 and the second pad electrode 222 to improve bonding strength of the light emitting device 150R.

Thereafter, the first pad electrode 221 is connected to the light emitting device 150R, and power can be applied.

Next, a molding layer 230 can be formed on the barrier wall 200S of the substrate 200 and the assembly hole 203. The molding layer 230 can be a transparent resin or a resin containing a reflective material or a scattering material.

FIG. 9 shows a state in which a light emitting device is inserted into a substrate by the self-assembly method shown in FIG. 8.

As shown in FIGS. 8 and 9, the light emitting device 150 can be pulled by the magnetic material of the assembly device 1100 and inserted into the assembly hole 203 of the substrate 200.

On the substrate 200, the first wiring electrode 201 and the second wiring electrode 202 can be spaced apart from each other.

An insulating layer 205 can be disposed on the first wire electrode 201 and the second wire electrode 202, and an insulating layer 206 can be disposed on the insulating layer 205. For convenience, each of the insulating layer 2050 and the insulating layer 206 can be referred to as a first insulating layer and a second insulating layer.

The first insulating layer 205 and the second insulating layer 206 can be formed of the same material or different materials, but are not limited thereto. For example, the first insulating layer 205 can be formed of an inorganic material and the second insulating layer 206 can be formed of an organic material, but can be formed conversely.

The second insulating layer 206 can be provided with an assembly hole 203 into which the light emitting device 150 can be inserted. An upper surface of the first insulating layer 205 can be exposed through the assembly hole 203 of the second insulating layer 206.

When the light emitting device 150 is inserted into the assembly hole 203, the lower surface of the light emitting device can come into contact with the upper surface of the first insulating layer 205 exposed through the assembly hole 203.

For example, a voltage can be applied to the first wire electrode 201 and the second wire electrode 202 to form an electric field between the first wire electrode 201 and the second wire electrode 202. The dielectrophoretic force caused by such an electric field can affect the light emitting device 150. That is, the light emitting device 150 inserted into the assembly hole 203 can be fixed to the upper surface of the first insulating layer 205 while maintaining the inserted state in the assembly hole 203 by the dielectrophoretic force formed between the first wire electrode 201 and the second wire electrode 202.

Although not shown, in a subsequent process, an insulating layer can be formed in the space of the assembly hole 203 not occupied by the light emitting device 150, and then the first pad electrode (210 in FIG. 5) and the second pad electrode 220 can be formed. Also, a first connection electrode 261 can be formed to connect the first electrode of the light emitting device 150 to the first pad electrode 210 and a second connection electrode 262 can be formed to connect the second electrode of the light emitting device 150 to the second pad electrode 220. Accordingly, when a voltage is applied to the first pad electrode (210 in FIG. 5) and the second pad electrode 220, the light emitting device 150 can emit light.

Meanwhile, in the display device according to the embodiment, a light emitting device is used as a light source. The light emitting device of the embodiment is a self-emitting device that emits light by itself when electricity is applied, and can be a semiconductor light emitting device. Since the light emitting device of the embodiment is made of an inorganic semiconductor material, it is resistant to deterioration and has a semi-permanent lifespan, so it can contribute to realizing high-quality and high-definition images in a display device by providing stable light.

FIG. 10 is a schematic cross-sectional view of the display panel of FIG. 2.

Referring to FIG. 10, the display panel 10 of the embodiment can include a first substrate 40, a light emitting unit 41, a color generating unit 42, and a second substrate 46. The display panel 10 of the embodiment can include more components than these, but is not limited thereto. The first substrate 40 can be the substrate 200 shown in FIG. 7.

Although not shown, at least one insulating layer can be disposed between the first substrate 40 and the light emitting part 41, between the light emitting unit 41 and the color generator 42 and/or between the color generator 42 and the second substrate 46, but is not limited thereto.

The first substrate 40 can support the light emitting unit 41, the color generating unit 42, and the second substrate 46. Various elements as described above can be formed on the second substrate 46, for example, data lines D1 to Dm (m is an integer of 2 or greater), scan lines (S1 to Sn), a high potential voltage line (VDDL) and a low potential voltage line (VSSL) as shown in FIG. 2, as shown in FIG. 3, a plurality of transistors and at least one capacitor, and as shown in FIG. 4, the first pad electrode 210 and the second pad electrode 220.

The first substrate 40 can be formed of glass, but is not limited thereto.

The light emitting unit 41 can provide light to the color generating unit 42. The light emitting unit 41 can include a plurality of light sources that emit light themselves by applying electricity. For example, the light source can include a light emitting device (300 in FIG. 5, 150 in FIGS. 6 and 12, 150A in FIGS. 16 and 150B in FIG. 17).

For example, the plurality of light emitting devices 150 can be separately disposed for each sub-pixel of a pixel and independently emit light by controlling each sub-pixel.

As another example, the plurality of light emitting devices 150 can be arranged regardless of pixel division and simultaneously emit light from all sub-pixels.

The light emitting device 150 of the embodiment can emit blue light, but is not limited thereto. For example, the light emitting device 150 of the embodiment can emit white light or purple light.

Meanwhile, the light emitting device 150 can emit red light, green light, and blue light for each sub-pixel. To this end, for example, a red light emitting device emitting red light can be disposed in a first sub-pixel, that is, a red sub-pixel, a green light emitting device emitting green light can be disposed in a second sub-pixel, ie, a green sub-pixel, and a blue light emitting device emitting blue light can be disposed in a third sub-pixel, ie, a blue sub-pixel.

For example, each of a red light emitting device, a green light emitting device, and a blue light emitting device can include a group II-IV compound or a group III-V compound, but is not limited thereto. For example, the III-V compound can be selected from the group consisting of a binary compound selected from the group consisting of GaN, GaP, GaAs, GaSb, AlN, AlP, AlAs, AlSb, InN, InP, InAs, InSb and mixtures thereof, a three-element compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The color generating unit 42 can generate light of a different color from the light provided by the light emitting unit 41.

For example, the color generator 42 can include a first color generator 43, a second color generator 44, and a third color generator 45. The first color generator 43 can be correspond to the first sub-pixel PX1 of the pixel, and the second color generator 44 can correspond to the second sub-pixel PX2 of the pixel, and the third color generator can correspond to the third sub-pixel PX3 of the pixel.

The first color generating unit 43 can generate first color light based on the light provided from the light emitting unit 41, the second color generating unit 44 can generate second color light based on the light provided from the light emitting unit 41, and the third color generating unit 45 can generate third color light based on the light provided from the light emitting unit 41. For example, the first color generating unit 43 outputs blue light from the light emitting unit 41 as red light, the second color generator 44 outputs blue light from the light emitting unit 41 as green light, and the third color generator 45 outputs blue light from the light emitting unit 41 as it is.

For example, the first color generator 43 includes a first color filter, and the second color generator 44 can include a second color filter, and the third color generator can include a third color filter.

The first color filter, the second color filter, and the third color filter can be formed of a transparent material through which light can pass.

For example, at least one of the first color filter, the second color filter, and the third color filter can include a quantum dot.

The quantum dot of the embodiment can be selected from a group II-IV compound, a group IV-VI compound, a group IV element, a group IV compound, and a combination thereof.

The II-VI compound can be selected from the group consisting of a binary compound selected from the group consisting CdSe, CdTe, ZnS, ZnSe, ZnTe, ZnO, HgS, HgSe, HgTe, MgSe, MgS and mixtures thereof, a three-element compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS and mixtures thereof and quaternary compounds selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe and mixtures thereof.

The III-V compound can be selected from the group consisting of a binary compound selected from the group consisting of GaN, GaP, GaAs, GaSb, AlN, AlP, AlAs, AlSb, InN, InP, InAs, InSb and mixtures thereof, a three-element compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

The IV-VI compound can be selected from the group consisting of a binary compound selected from the group consisting SnS, SnSe, SnTe, PbS, PbSe, PbTe and mixtures thereof, a three-element compound selected from the group consisting of SnSeS, SnSeTe, SnSTe, PbSeS, PbSeTe, PbSTe, SnPbS, SnPbSe, SnPbTe and mixtures thereof and quaternary compounds selected from the group consisting of SnPbSSe, SnPbSeTe, SnPbSTe and mixtures thereof.

Group IV elements can be selected from the group consisting of Si, Ge, and mixtures thereof. The group IV compound can be a binary element compound selected from the group consisting of SiC, SiGe, and mixtures thereof.

These quantum dots can have a full width of half maximum (FWHM) of an emission wavelength spectrum of about 45 nm or less, and light emitted through the quantum dots can be emitted in all directions. Accordingly, the viewing angle of the light emitting display device can be improved.

On the other hand, quantum dots can have the form of spherical, pyramidal, multi-arm, or cubic nanoparticles, nanotubes, nanowires, nanofibers, nanoplatelet particles, etc. but, is not limited to this.

For example, when the light emitting device 150 emits blue light, the first color filter can include red quantum dots, and the second color filter can include green quantum dots. The third color filter can not include quantum dots, but is not limited thereto. For example, blue light from the light emitting device 150 is absorbed by the first color filter, and the absorbed blue light is wavelength-shifted by red quantum dots to output red light. For example, blue light from the light emitting device 150 is absorbed by the second color filter, and the wavelength of the absorbed blue light is shifted by green quantum dots to output green light. For example, blue light from a foot and an element can be absorbed by the third color filter, and the absorbed blue light can be emitted as it is.

Meanwhile, when the light emitting device 150 emits white light, not only the first color filter and the second color filter, but also the third color filter can include quantum dots. That is, the wavelength of white light of the light emitting device 150 can be shifted to blue light by the quantum dots included in the third color filter.

For example, at least one of the first color filter, the second color filter, and the third color filter can include a phosphor. For example, some of the first color filters, the second color filters, and the third color filters can include quantum dots, and others can include phosphors. For example, each of the first color filter and the second color filter can include a phosphor and a quantum dot. For example, at least one of the first color filter, the second color filter, and the third color filter can include scattering particles. Since blue light incident on each of the first color filter, the second color filter, and the third color filter is scattered by the scattering particles and the color of the scattered blue light is shifted by the corresponding quantum dots, light output efficiency can be improved.

As another example, the first color generator 43 can include a first color conversion layer and a first color filter. The second color generator 44 can include a second color converter and a second color filter. The third color generator 45 can include a third color conversion layer and a third color filter. Each of the first color conversion layer, the second color conversion layer, and the third color conversion layer can be disposed adjacent to the light emitting unit 41. The first color filter, the second color filter and the third color filter can be disposed adjacent to the second substrate 46.

For example, the first color filter can be disposed between the first color conversion layer and the second substrate 46. For example, the second color filter can be disposed between the second color conversion layer and the second substrate 46. For example, the third color filter can be disposed between the third color conversion layer and the second substrate 46.

For example, the first color filter can contact the upper surface of the first color conversion layer and have the same size as the first color conversion layer, but is not limited thereto. For example, the second color filter can contact the upper surface of the second color conversion layer and have the same size as the second color conversion layer, but is not limited thereto. For example, the third color filter can contact the upper surface of the third color conversion layer and have the same size as the third color conversion layer, but is not limited thereto.

For example, the first color conversion layer can include red quantum dots, and the second color conversion layer can include green quantum dots. The third color conversion layer can not include quantum dots. For example, the first color filter can include a red-based material that selectively transmits the red light converted in the first color conversion layer, the second color filter can include a green-based material that selectively transmits the green light converted in the second color conversion layer, and the third color filter can include a blue-based material that selectively transmits blue light transmitted through the third color conversion layer as it is.

Meanwhile, when the light emitting device 150 emits white light, not only the first color conversion layer and the second color conversion layer, but also the third color conversion layer can include quantum dots. That is, the wavelength of white light of the light emitting device 150 can be shifted to blue light by the quantum dots included in the third color filter.

Referring back to FIG. 10, the second substrate 46 can be disposed on the color generator 42 to protect the color generator 42. The second substrate 46 can be formed of glass, but is not limited thereto.

The second substrate 46 can be called a cover window, a cover glass, or the like.

The second substrate 46 can be formed of glass, but is not limited thereto.

Meanwhile, the embodiment provides a light emitting device that does not stick to the bottom surface of a substrate.

The embodiment provides a display device capable of improving the assembly rate by performing self-assembly using a light emitting device that does not stick to the bottom surface of a substrate.

The embodiment can provide a display device capable of dramatically improving the self-assembly speed by performing self-assembly using a light emitting device that does not stick to the bottom surface of a substrate.

Another object of the embodiment is to provide a display device capable of securing high luminance by improving light efficiency by performing self-assembly using a light emitting device that does not stick to the bottom surface of a substrate.

Hereinafter, various embodiments for achieving this problem will be described.

First Embodiment

FIG. 11 is a plan view showing the light emitting device according to the first embodiment, and FIG. 12 is a cross-sectional view showing the light emitting device according to the first embodiment.

Referring to FIGS. 11 and 12, the light emitting device 150 according to the first embodiment can include a plurality of first conductivity-type semiconductor layers 171, an active layer 172, a plurality of second conductivity-type semiconductor layers 173, a first electrode 180 and a second electrode 190. The light emitting device 150 according to the first embodiment can be the light emitting device 300 of FIG. 5 or the light emitting device 150 of FIG. 6.

The light emitting device 150 according to the first embodiment can have a circular shape, but is not limited thereto. For example, the plurality of second conductivity-type semiconductor layers 173 can have a circular shape when viewed from above. For example, the active layer 172 can have a circular shape when viewed from above. For example, the plurality of first conductivity-type semiconductor layers 171 can have a circular shape when viewed from above.

The light emitting device 150 according to the first embodiment can be a horizontal light emitting device, but is not limited thereto. The light emitting device 150 according to the first embodiment can be a red light emitting device (150R in FIG. 6) emitting red light, but is not limited thereto. For example, the light emitting device 150 according to the first embodiment can include a compound semiconductor. The compound semiconductor includes a group II-IV compound or a group III-V compound. For example, the III-V compound can be selected from the group consisting of a binary compound selected from the group consisting of GaP, GaAs, GaSb, AlP, AlAs, AlSb, InP, InAs, InSb and mixtures thereof, a three-element compound selected from the group consisting of GaNP, GaNAs, GaNSb, GaPAs, GaPSb, AlInP, AlNP, AlNAs, AlNSb, AlPAs, AlPSb, InNP, InNAs, InNSb, InPAs, InPSb, GaAlNP and mixtures thereof and quaternary compounds selected from the group consisting of AlGaInP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb and mixtures thereof.

For example, a plurality of first conductivity-type semiconductor layers 171, an active layer 172, and a plurality of second conductivity-type semiconductor layers 173 can be grown on a substrate (not shown). This substrate can be removed and the substrate can not be seen in the final product of the light emitting device as shown in FIG. 12, but this is not limited thereto. The substrate can be a sapphire substrate or a semiconductor substrate, but is not limited thereto.

The plurality of first conductivity-type semiconductor layers 171 can be provided as a compound semiconductor. The plurality of first conductivity-type semiconductor layers 171 can be provided as, for example, group 2-6 compound semiconductors or group 3-5 compound semiconductors. For example, the plurality of first conductivity-type semiconductor layers 171 can be doped with an n-type dopant such as Si, Ge, Sn, Se, or Te.

The active layer can generate light of a wavelength band corresponding to a combination of first carriers (eg, electrons) provided from the plurality of first conductivity-type semiconductor layers 171 and second carriers (eg, holes) provided from the plurality of second conductivity-type semiconductor layers 173. The active layer 172 can have any one or more of a single well structure, a multi-well structure, a quantum dot structure, or a quantum wire structure. The active layer 172 can be provided as a compound semiconductor. The active layer 172 can be provided with, for example, a Group 2-6 or Group 3-5 compound semiconductor. When the active layer 172 is provided in a multi-well structure, the active layer 172 can be provided by stacking a plurality of barrier layers and a plurality of well layers.

The plurality of second conductivity-type semiconductor layers 173 can be provided as a compound semiconductor. The plurality of second conductivity-type semiconductor layers 173 can be provided as, for example, group 2-6 compound semiconductors or group 3-5 compound semiconductors. For example, the plurality of second conductivity-type semiconductor layers 173 can be doped with a p-type dopant such as Mg, Zn, Ca, Sr, or Ba.

When the plurality of first conductivity-type semiconductor layers 171, the active layer 172, and the plurality of second conductivity-type semiconductor layers 173 are grown, mesa etching can be performed to partially remove the plurality of second conductivity-type semiconductor layers 173, the active layer 172, and the plurality of first conductivity-type semiconductor layers 171. For example, as shown in FIGS. 11 and 12, the plurality of second conductivity-type semiconductor layers 173 and the active layer 172 corresponding to the peripheral area excluding the central area of the light emitting device 150 according to the first embodiment are removed, upper portions of the plurality of first conductivity-type semiconductor layers 171 can be removed. A peripheral region can surround the central region.

As an example, mesa etching can be performed using a photoresist pattern. That is, a mesa structure can be obtained by forming a protective pattern in the central region of the light emitting device 150 according to the first embodiment and performing mesa etching using the protective pattern as a mask.

As another example, mesa etching can be performed using the second electrode 190. That is, a mesa structure can be obtained by forming the second electrode 190 in the central region of the light emitting device 150 according to the first embodiment and performing mesa etching using the second electrode 190 as a mask.

After the plurality of first conductivity-type semiconductor layers 171, the active layer 172, and the plurality of second conductivity-type semiconductor layers 173 are grown, the second electrode 190 can be formed in the central region of the light emitting device 150 according to the first embodiment. In this case, each of the plurality of mesa-etched second conductivity-type semiconductor layers 173, the active layer 172, and the plurality of first conductivity-type semiconductor layers 171 can have the same size as the second electrode 190.

The first electrode 180 can be formed on the upper surface of the plurality of first conductivity-type semiconductor layers 171 exposed by mesa etching, and the second electrode 190 can be formed on top surfaces of the plurality of second conductivity-type semiconductor layers 173. In this case, the first electrode 180 can surround the second electrode 190.

Each of the first electrode 180 and the second electrode 190 can include a plurality of layers, but is not limited thereto.

The second electrode 190 can include a transparent conductive material. For example, the second electrode 190 can include a conductive material such as ITO, ZnO, GZO, or IGZO. When the second electrode 190 is formed on the plurality of second conductivity-type semiconductor layers 173 using such a conductive material, a current spreading effect occurs along the surface of the second electrode 190, a current can flow from the entire area of the second electrode 190 to the plurality of second conductivity-type semiconductor layers 173, and uniform light emission can be possible in the entire area of the active layer 172.

As shown in FIG. 11, the first electrode 180 is located in the central region of the light emitting device 150 according to the first embodiment, and the first electrode 180 can surround the second electrode 190. The light emitting device 150 according to the first embodiment can include a central region and a peripheral region surrounding the central region. For example, the central region can be a region not etched by mesa etching, and the peripheral region can be a region removed by mesa etching. In this case, the first electrode 180 can be disposed on the plurality of first conductivity-type semiconductor layers 171 located in the peripheral area, and the second electrode 190 can be disposed on the plurality of second conductivity-type semiconductor layers 173 located in the central region. As described above, in the light emitting device 150 according to the embodiment, since the peripheral area except for the central area is removed by mesa etching, the second electrode 190 can surround the first electrode 180.

In FIG. 11, although the first electrode 180 is illustrated as being disposed on a partial region of the top surface of the plurality of first conductivity-type semiconductor layers 171, the first electrode 180 can be disposed on the entire area of the top surface of the plurality of first conductivity-type semiconductor layers 171. In FIG. 12, although the second electrode 190 is shown as being disposed on a partial region of the upper surface of the plurality of second conductivity-type semiconductor layers 173, the second electrode 190 can be disposed on the entire area of the top surface of the plurality of second conductivity-type semiconductor layers 173.

For example, the first electrode 180 can have a closed loop shape surrounding the second electrode 190. For example, the second electrode 190 can have a circular shape when viewed from above. Since the first electrode 180 has a loop shape, in the second electrode 190, current can flow uniformly to the first electrode 180 along a radial direction via the plurality of second conductivity-type semiconductor layers 173, the active layer 172, and the plurality of first conductivity-type semiconductor layers 171. Accordingly, since electrons in the entire region of the plurality of first conductivity-type semiconductor layers 171 are injected into the active layer 172 and contribute to light emission, light emitting efficiency can be improved.

As shown in FIG. 12, the light emitting device 150 according to the first embodiment can have a circular shape, but is not limited thereto. For example, the plurality of second conductivity-type semiconductor layers 173 can have a circular shape when viewed from above. For example, the active layer 172 can have a circular shape when viewed from above. For example, the plurality of first conductivity-type semiconductor layers 171 can have a circular shape when viewed from above.

Hereinafter, the plurality of first conductivity-type semiconductor layers 171 of the embodiment will be described in detail.

The plurality of first conductivity-type semiconductor layers 171 can include an adsorption prevention layer 171_1, a cladding layer 171_2, and a contact layer 171_3. For example, one of the adsorption prevention layer 171_1, the cladding layer 171_2, and the contact layer 171_3 can be referred to as a first-first conductivity-type semiconductor layer, and the other is referred to as a first-second conductivity-type semiconductor layer. Another one can be referred to as a first-third conductivity-type semiconductor layer.

The adsorption prevention layer 171_1, the cladding layer 171_2, and the contact layer 171_3 can include a group II-IV compound or a group III-V compound, but are not limited thereto. Since the types of III-V compounds have been described above, types of III-V compounds are omitted.

The embodiment can include an adsorption prevention layer 171_1 so that the light emitting device 150 according to the first embodiment is not adsorbed to the bottom surface of the substrate during self-assembly by the adsorption prevention layer 171_1. Normally, the first conductivity-type semiconductor layer 171 includes Al, and the charge characteristics are affected according to the Al content. During self-assembly, the corresponding light emitting device can be adsorbed to the bottom surface of the substrate due to the first conductivity-type semiconductor layer 171 affected by charge characteristics.

Therefore, in the embodiment, an adsorption prevention layer 171_1 having an adjusted Al content can be provided in the first conductivity-type semiconductor layer so that the corresponding light emitting device can not be adsorbed to the bottom surface of the substrate. This will be described in more detail below.

Among the adsorption prevention layer 171_1, the cladding layer 171_2, and the contact layer 171_3, the adsorption prevention layer 171_1 can be disposed farthest from the active layer 172. That is, the adsorption prevention layer 171_1 can be disposed further away from the active layer 172 than the cladding layer 171_2 and the contact layer 171_3. For example, the contact layer 171_3 can be disposed under the active layer 172, the cladding layer 171_2 can be disposed under the contact layer 171_3, and the adsorption prevention layer 171_1 can be disposed under the cladding layer 171_2.

The adsorption prevention layer 171_1 can prevent the light emitting device 150 according to the first embodiment from being adsorbed to the substrate during self-assembly. For example, the adsorption prevention layer 171_1 can include $Al_{x1}Ga_{(1-x1)}InP$, but is not limited thereto.

For example, x1 can be 0.6 or less to serve as the adsorption prevention layer 171_1. Preferably, x1 can be greater than or equal to 0.2 and less than or equal to 0.6. As shown in FIG. 15, when x1 is less than 0.2, the assemblage rate decreases, and when x1 exceeds 0.6, the possibility that the light emitting device 150 according to the first embodiment is adsorbed to the bottom surface of the substrate can increase. For example, when x1 is 0.4, the adsorption prevention layer 171_1 can include $Al_{0.4}Ga_{0.6}InP$.

For example, the concentration ratio of Al to Ga of the adsorption prevention layer 171_1 can be 0.5 or more and 5 or less. Here, the concentration means weight %, and the concentration of Al can be 0.5 or more and 5 or less compared to the concentration of Ga. For example, when the concentration of Ga is 5% by weight, the concentration of A can be 2.5% by weight or more and 25% by weight.

For example, the adsorption prevention layer 171_1 can have a thickness of 2 μm or less to serve as the adsorption prevention layer 171_1. Preferably, the thickness of the adsorption prevention layer 171_1 can be 0.5 μm or more and 1.5 μm or less. When the thickness of the adsorption prevention layer 171_1 is less than 0.5 μm, the thickness is very thin and cannot function as the adsorption prevention layer 171_1. As shown in FIG. 15, when the thickness of the adsorption prevention layer 171_1 exceeds 1.5 μm, the light emitting device 150 according to the first embodiment can be more likely to be adsorbed to the bottom surface of the substrate.

The cladding layer 171_2 can supply, for example, electrons to the active layer 172. For example, the cladding layer 171_2 can include at least one semiconductor layer.

For example, the cladding layer 171_2 can include $Al_{x2}Ga_{(1-x2)}InP$, but is not limited thereto. For example, x2 can be smaller than x1. For example, when x1 is 0.6, x2 can be 0.2. In this case, the adsorption prevention layer 171_1 can include $Al_{0.6}Ga_{0.4}InP$, and the clad layer 171_2 can include $Al_{0.2}Ga_{0.8}InP$.

The cladding layer 171_2 can be disposed between the active layer 172 and the adsorption prevention layer 171_1. For example, the lower surface of the cladding layer 171_2 can contact the upper surface of the adsorption prevention layer 171_1, but is not limited thereto.

The contact layer 171_3 can allow electrons of the cladding layer 171_2 to be easily supplied to the active layer 172. For example, the contact layer 171_3 can include AlInP, but is not limited thereto.

FIG. 13A illustrates a portion of a plurality of first conductivity-type semiconductor layers according to a comparative example, and FIG. 13B illustrates a portion of a plurality of first conductivity-type semiconductor layers in a light emitting device according to a first embodiment.

As shown in FIG. 13A, in the comparative example, the first conductivity-type semiconductor layer 110 can be formed of a single semiconductor layer including AlInP. The first conductivity-type semiconductor layer 110 of the comparative example can not contain Ga but can contain Al. In this case, as shown in FIG. 14A, when self-assembly is performed, since many of the light emitting devices 510 of the comparative example are adsorbed to the bottom surface of the substrate 500, there are not many light emitting devices 510 assembled to a specific site of the substrate 500, and the assembly rate can be reduced. Therefore, since a desired number of light emitting devices 510 are not assembled at a specific site, luminance and light efficiency are lowered, making it difficult to commercialize the display.

As shown in FIG. 13B, in an embodiment, the first conductivity-type semiconductor layer 171 can include at least an adsorption prevention layer 171_1 and a cladding layer 171_2.

For example, the ratio of the thickness of the adsorption prevention layer 171_1 to the thickness of the cladding layer 171_2 can be at least 1 or less. That is, the thickness t1 of the adsorption prevention layer 171_1 can be equal to or smaller than the thickness t2 of the cladding layer 171_2.

As shown in FIG. 14B, it can be seen that the light emitting devices 150 according to the first embodiment are hardly adsorbed to the bottom surface of the substrate 200 during self-assembly. Accordingly, each of the light emitting devices 150 according to the first embodiment can be assembled at a specific site.

In the embodiment, when the adsorption prevention layer 171_1 is disposed under the clad layer 171_2, the adsorption prevention layer 171_1 is disposed, during self-assembly, the adsorption prevention layer 171_1 can prevent the light emitting devices 150 according to the first embodiment from being adsorbed to the bottom surface of the substrate. Accordingly, since more light emitting devices 150 according to the first embodiment can be assembled at a specific site rather than adsorbed on the bottom surface of the substrate, the assembly rate is remarkably improved to improve light efficiency and manufacture a display device that implements high luminance.

FIG. 15 shows the assembly and adsorption characteristics according to the Al content of the adsorption prevention layer and the thickness of the adsorption prevention layer.

As shown in FIG. 15, it can be seen that the assembly rate is excellent in the X region and the adsorption rate to the bottom surface of the substrate is also lowered. For example, x1 can be 0.2 or more and 0.6 or less in $Al_{x1}Ga_{(1-x1)}InP$ included in the adsorption prevention layer 171_1 in the X region. For example, the thickness of the adsorption prevention layer 171_1 in the X region can be 0.5 μm or more or 1.5 μm or less. For example, in the Y region, x1 can exceed 0.6 and the thickness of the adsorption prevention layer 171_1 can be 0.5 μm or more and 2 μm or less. For example, in region Y, x1 can be greater than or equal to 0.2 and less than or equal to 0.6, and the thickness of the adsorption prevention layer 171_1 can be greater than 1.5 μm and less than or equal to 2 μm. For example, x1 can be less than 0.2 in the Z region. For example, the thickness of the adsorption prevention layer 171_1 in the Z region can be 0.5 μm or more and 2 μm or less.

FIG. 16 is a cross-sectional view showing a light emitting device according to a second embodiment.

In the second embodiment, except for the shielding layer 175, it is the same as in the first embodiment. In the second embodiment, the same reference numerals are given to components having the same function, structure and/or shape as those in the first embodiment, and detailed descriptions are omitted.

The missing description below can be easily understood from the description of the first embodiment.

Referring to FIG. 16, the light emitting device 150A according to the second embodiment can include a plurality of first conductivity-type semiconductor layers 171, an active layer 172, a plurality of second conductivity-type semiconductor layers 173, a first electrode 180 and a second electrode 190. The light emitting device 150A according to the second embodiment can be the light emitting device 300 of FIG. 5 or the light emitting device 150 of FIG. 6.

The plurality of first conductivity-type semiconductor layers 171 can include an adsorption prevention layer 171_1, a cladding layer 171_2, and a contact layer 171_3. For example, one of the adsorption prevention layer 171_1, the cladding layer 171_2, and the contact layer 171_3 can be referred to as a first-first conductivity-type semiconductor layer, and the other can be referred to as a first-second conductivity-type semiconductor layer, and another one can be referred to as a first-third conductivity-type semiconductor layer. Since each of the adsorption prevention layer 171_1, the cladding layer 171_2, and the contact layer 171_3 has been described in the second embodiment, a detailed description thereof will be omitted.

The light emitting device 150A according to the second embodiment can include a shielding layer 175. For example, the shielding layer 175 can be disposed under the active layer 172. For example, the shielding layer 175 can be disposed under the first conductivity-type semiconductor layer 171. For example, the shielding layer 175 can be disposed below the adsorption prevention layer 171_1. For example, the upper surface of the shielding layer 175 can contact the lower surface of the adsorption prevention layer 171_1, but is not limited thereto.

The shielding layer 175 can shield Al electronegativity of the first conductivity-type semiconductor layer 171, that is, the contact layer 171_3, the cladding layer 171_2, and/or the adsorption prevention layer 171_1. Electronegativity is the ability of an atom to attract the pair of electrons it gives up to share with each other when they form a covalent bond. For example, the greater the electronegativity, the more negative (−) charge.

Due to the electronegativity of Al included in the first conductivity-type semiconductor layer 171, the cladding layer 171_2 and/or the adsorption prevention layer 171_1 can have a negative (−) charge. In this way, when the first conductivity-type semiconductor layer 171 has a negative (−) charge, the light emitting device 150A according to the second embodiment can be adsorbed to the bottom surface of the substrate during self-assembly.

In the second embodiment, as the shielding layer 175 is provided adjacent to the first conductivity-type semiconductor layer 171, even if self-assembly is performed, the light emitting device 150A according to the second embodiment is not adsorbed to the bottom surface of the substrate. Accordingly, more light emitting devices 150A according to the second embodiment can be assembled at a specific site rather than adsorbed to the bottom surface of the substrate, a display device having improved light efficiency and high luminance can be manufactured because the assembling rate is remarkably improved.

In particular, in the embodiment, the thickness of the shielding layer 175 can be at least 300 nm or more. As the Al electrical conductivity of the first conductivity-type semiconductor layer 171 is shielded by the thick shielding layer 175 as described above, during self-assembly, the light emitting device 150A according to the second embodiment can not be adsorbed to the bottom surface of the substrate.

For example, the shielding layer 175 can be a third conductivity-type semiconductor layer. The third conductivity-type semiconductor layer can include a compound semiconductor, but is not limited thereto. For example, the third conductivity-type semiconductor layer can not include Al. For example, the third conductivity-type semiconductor layer can include GaInP.

For example, the shielding layer 175 can include an n-type dopant such as Si, Ge, Sn, Se, or Te. Alternatively, the shielding layer 175 can not include a dopant or can include a p-type dopant.

Meanwhile, the shielding layer 175 can be an etch stop layer. For example, as described above, after the first conductivity-type semiconductor layer 171, the active layer 172, and the second conductivity-type semiconductor layer 173 are grown on a substrate (not shown), the substrate can be removed.

For example, the substrate can be removed using a chemical lift-off process. That is, when the light emitting device 150A according to the second embodiment is immersed in the chemical etchant and etching proceeds, the shielding layer 175 can prevent the first conductivity-type semiconductor layer 171 from being etched by the chemical etchant.

Meanwhile, although not shown, a metal layer can be further provided under the shielding layer 175. Assembly rate can be improved by the metal layer disposed under the shielding layer 175. The metal layer can be any metal. Preferably, the metal layer can include a magnetizable nickel layer. In this case, when the self-assembly is performed, the nickel layer included in the light emitting device 150A according to the second embodiment is magnetized by the magnetic material, so that the light emitting device 150A according to the second embodiment can move along the moving direction of the magnetic material, and a moving light emitting device can be assembled at a specific site.

FIG. 17 is a cross-sectional view showing a light emitting device according to a third embodiment.

The third embodiment is the same as the second embodiment except for the shape. That is, while the light emitting device 150A according to the second embodiment (FIG. 16) has a circular shape, the light emitting device 150B according to the third embodiment can not have a circular shape.

Referring to FIG. 17, the light emitting device 150B according to the third embodiment can include a plurality of first conductivity-type semiconductor layers 171, an active layer 172, a plurality of second conductivity-type semiconductor layers 173, a shielding layer 175, a first electrode 180 and a second electrode 190. The shielding layer 175 can be omitted. The light emitting device 150B according to the third embodiment can be the light emitting device 300 of FIG. 5 or the light emitting device 150 of FIG. 6.

The plurality of first conductivity-type semiconductor layers 171 can include an adsorption prevention layer 171_1, a cladding layer 171_2, and a contact layer 171_3. For example, one of the adsorption prevention layer 171_1, the cladding layer 171_2, and the contact layer 171_3 can be referred to as a first-first conductivity-type semiconductor layer, another one can be referred to as a first-second conductivity-type semiconductor layer, and another can be referred to as a first-third conductivity-type semiconductor layer. Since each of the adsorption prevention layer 171_1, the cladding layer 171_2, and the contact layer 171_3 has been described in the second embodiment, a detailed description thereof will be omitted.

The light emitting device 150B according to the third embodiment can have a square shape when viewed from above, but is not limited thereto. In this case, the upper surface of the first conductivity-type semiconductor layer 171 is exposed by mesa etching of a portion of the corner of the rectangular light emitting device 150B. A first electrode 180 can be formed on the exposed top surface of the first conductivity-type semiconductor layer 171, and a second electrode 190 can be formed on the top surface of the second conductivity-type semiconductor layer 173.

The shape of the light emitting device 150B according to the third embodiment is just one example, and various other shapes are possible.

Meanwhile, the above-described light emitting devices 150, 150A, and 150B have been described as being limited to lateral light emitting devices.

However, the light emitting devices 150, 150A, and 150B of the embodiment can be applied to other light emitting devices, for example, a flip chip type light emitting device or a vertical type light emitting device.

In the case of a vertical light emitting device, the first electrode 180 can be disposed on the lower surface of the first conductivity-type semiconductor layer 171. For example, the vertical light emitting device can have a size of 5 μm to 50 μm when viewed from above. For example, the vertical light emitting device can have a size of 5 μm to 30 μm when viewed from above.

The above detailed description should not be construed as limiting in all respects and should be considered as illustrative. The scope of the embodiments should be determined by reasonable interpretation of the appended claims, and all changes within the equivalent range of the embodiments are included in the scope of the embodiments.

INDUSTRIAL APPLICABILITY

The embodiment can be applied to a light emitting device capable of improving light efficiency and securing high luminance by preventing adsorption to a substrate. For example, the light emitting device includes a cylindrical light emitting device, a disc-shaped light emitting device, a micro light emitting device, a nano light emitting device, and a rod light emitting device, but is not limited thereto.

The embodiment can be adopted in the display field for displaying images or information.

The invention claimed is:

1. A light emitting device comprising:

an active layer;

a plurality of first conductivity-type semiconductor layers under the active layer;

a plurality of second conductivity-type semiconductor layers on the active layer;

a shielding layer disposed under the plurality of first conductivity-type semiconductor layers, and a metal layer disposed under the shielding layer, wherein the metal layer comprises a magnetizable nickel layer, wherein the plurality of first conductivity-type semiconductor layers comprise an adsorption prevention layer spaced farthest from the active layer, wherein the adsorption prevention layer includes $(Al_{x1}Ga_{1-x1})_{1-y1}In_{y1}P$, and the x1 is 0.6 or less, wherein a thickness of the adsorption prevention layer is 2 micrometer ($\mu$m) or less, wherein the adsorption prevention layer is configured to prevent the light emitting device from sticking to a bottom surface of a substrate, and wherein the shielding layer is be configured to shield aluminum (Al) electronegativity of a first conductivity-type semiconductor layer of the plurality of first conductivity-type semiconductor layers.

2. The light emitting device according to claim 1, wherein the x1 is greater than or equal to 0.2 and less than or equal to 0.6.

3. The light emitting device according to claim 1, wherein the thickness of the adsorption prevention layer is 0.5 $\mu$m or more and 1.5 $\mu$m or less.

4. The light emitting device according to claim 1, wherein a ratio of concentration of Al to gallium (Ga) of Ga of the adsorption prevention layer is 0.5 or more and 5 or less.

5. The light emitting device according to claim 1, wherein a thickness of the shielding layer is at least 300 nanometers (nm) or more.

6. The light emitting device according to claim 1, wherein the shielding layer comprises a semiconductor layer.

7. The light emitting device according to claim 6, wherein the shielding layer comprises gallium indium phosphide (GaInP).

8. The light emitting device according to claim 6, wherein the shielding layer is configured not to contain Al.

9. The light emitting device according to claim 1, wherein the shielding layer is an etch stop layer.

10. The light emitting device according to claim 1, wherein the plurality of first conductivity-type semiconductor layers comprise a clad layer between the active layer and the adsorption prevention layer, and wherein the clad layer includes $(Al_{x2}Ga_{1-x2})_{1-y2}In_{y2}P$, and x2 is less than x1.

11. The light emitting device according to claim 10, wherein a ratio of the thickness of the adsorption prevention layer to a thickness of the clad layer is at least 1 or less.

12. The light emitting device according to claim 10, wherein the plurality of first conductivity-type semiconductor layers further comprise a contact layer disposed between the active layer and the clad layer.

13. The light emitting device according to claim 12, wherein the contact layer comprises aluminum indium phosphide (AlInP), and wherein the shielding layer is disposed below the adsorption prevention layer and is in-contact with a bottom surface of the adsorption prevention layer.

14. The light emitting device according to claim 1, further comprising a first electrode on the plurality of first conductivity-type semiconductor layers and a second electrode on the plurality of second conductivity-type semiconductor layers, and wherein the second electrode is located in a central region of the light emitting device, and the first electrode is configured to surround the second electrode.

15. The light emitting device according to claim 1, wherein the shielding layer is a third conductivity-type semiconductor layer, and wherein the shielding layer is disposed below the adsorption prevention layer and is in-contact with a bottom surface of the adsorption prevention layer.

16. A display device comprising:

a substrate;

a first and second wire electrodes on the substrate;

a partition layer having a plurality of assembly holes and on the first and second wire electrodes; and a light emitting device disposed in each of the plurality of assembly holes, wherein the light emitting device comprises an active layer;

a plurality of first conductivity-type semiconductor layers under the active layer;

a plurality of second conductivity-type semiconductor layers on the active layer;

a shielding layer disposed under the plurality of first conductivity-type semiconductor layers; and a metal layer disposed under the shielding layer, wherein the metal layer comprises a magnetizable nickel layer, wherein the plurality of first conductivity-type semiconductor layers comprise an adsorption prevention layer spaced farthest from the active layer, wherein the adsorption prevention layer includes $(Al_{x1}Ga_{1-x1})_{1-y1}In_{y1}P$, and the x1 is 0.6 or less, wherein a thickness of the adsorption prevention layer is 2 micrometer ($\mu$m) or less, wherein the adsorption prevention layer is configured to prevent the light emitting device from sticking to a bottom surface of the substrate, and wherein the shielding layer is be configured to shield aluminum (Al) electronegativity of a first conductivity-type semiconductor layer of the plurality of first conductivity-type semiconductor layers.

17. The display device according to claim 16, wherein the x1 is greater than or equal to 0.2 and less than or equal to 0.6.

18. The display device according to claim 16, wherein the thickness of the adsorption prevention layer is 0.5 $\mu$m or more and 1.5 $\mu$m or less.

19. The display device according to claim 16, wherein a ratio of concentration of Al to gallium (Ga) of the adsorption prevention layer is 0.5 or more and 5 or less.

20. The display device according to claim 16, wherein a thickness of the shielding layer is at least 300 nanometers (nm) or more.

* * * * *